United States Patent
Aluru et al.

(10) Patent No.: US 12,491,020 B2
(45) Date of Patent: Dec. 9, 2025

(54) METHODS AND SYSTEMS OF ELECTROSURGICAL COAGULATION DEVICES

(71) Applicants: SMITH & NEPHEW, INC., Memphis, TN (US); SMITH & NEPHEW ORTHOPAEDICS AG, Zug (CH)

(72) Inventors: Rajitha Aluru, Austin, TX (US); Jeffrey S. Wrana, Austin, TX (US); Chris Lynn, Austin, TX (US); Johnson E. Goode, Austin, TX (US); David A. Cox, Austin, TX (US)

(73) Assignees: SMITH & NEPHEW, INC., Memphis, TN (US); SMITH & NEPHEW ORTHOPAEDICS AG, Zug (CH)

( * ) Notice: Subject to any disclaimer, the term of this patent is extended or adjusted under 35 U.S.C. 154(b) by 699 days.

(21) Appl. No.: 17/775,523

(22) PCT Filed: Nov. 5, 2020

(86) PCT No.: PCT/US2020/059026
§ 371 (c)(1),
(2) Date: May 9, 2022

(87) PCT Pub. No.: WO2021/096748
PCT Pub. Date: May 20, 2021

(65) Prior Publication Data
US 2022/0409260 A1    Dec. 29, 2022

Related U.S. Application Data

(60) Provisional application No. 63/034,603, filed on Jun. 4, 2020, provisional application No. 62/936,185, filed on Nov. 15, 2019.

(51) Int. Cl.
*A61B 18/14* (2006.01)
*A61B 18/00* (2006.01)

(52) U.S. Cl.
CPC .... *A61B 18/14* (2013.01); *A61B 2018/00589* (2013.01); *A61B 2018/00744* (2013.01);
(Continued)

(58) Field of Classification Search
CPC ................ A61B 18/14; A61B 18/1482; A61B 2017/00973; A61B 2018/00178;
(Continued)

(56) References Cited

U.S. PATENT DOCUMENTS

2008/0234674 A1   9/2008   McClurken et al.
2009/0270796 A1   10/2009  Perry et al.
(Continued)

FOREIGN PATENT DOCUMENTS

| CN | 101677812 A | 3/2010 |
|---|---|---|
| JP | 2015196094 A | 11/2015 |
| JP | 2017515619 A | 6/2017 |

OTHER PUBLICATIONS

International Search Report and Written Opinion from PCT/US2020/059026 dated Feb. 9, 2021.
(Continued)

*Primary Examiner* — Michael F Peffley
(74) *Attorney, Agent, or Firm* — Dickinson Wright PLLC

(57) ABSTRACT

Electrosurgical coagulation devices. At least some of the example embodiment are methods including: applying RF energy between a first electrode and a second electrode, the first and second electrodes define an interstice; flowing an electrically conductive fluid through a first nozzle and a second nozzle of the first electrode, the first nozzle defines a first spray direction, the second nozzle defines a second spray direction, and a first angle between the first spray direction and the second spray direction is 180 angular degrees or less measured through the interstice; flowing an electrically conductive fluid through a third nozzle and a
(Continued)

fourth nozzle of the second electrode, the third nozzle defines a third spray direction, the fourth nozzle defines a fourth spray direction, and a second angle between the third spray direction and the fourth spray direction is 180 angular degrees or less measured through the interstice.

22 Claims, 20 Drawing Sheets

(52) U.S. Cl.
CPC ............... *A61B 2018/00767* (2013.01); *A61B 2018/1417* (2013.01); *A61B 2018/1472* (2013.01)

(58) Field of Classification Search
CPC .. A61B 2018/00589; A61B 2018/0066; A61B 2018/00744; A61B 2018/00767; A61B 2018/00863; A61B 2018/00922; A61B 2018/126; A61B 2018/1405; A61B 2018/1417; A61B 2018/1472; A61B 2218/002
See application file for complete search history.

(56) References Cited

U.S. PATENT DOCUMENTS

| | | | |
|---|---|---|---|
| 2010/0217255 A1* | 8/2010 | Greeley | A61B 18/1402 606/41 |
| 2014/0039493 A1* | 2/2014 | Conley | A61B 17/3203 606/45 |
| 2015/0272665 A1 | 10/2015 | Govari | |
| 2015/0272669 A1 | 10/2015 | Brucker et al. | |
| 2018/0085156 A1* | 3/2018 | Witt | A61B 18/14 |
| 2019/0059988 A1* | 2/2019 | Davison | A61B 18/1402 |

OTHER PUBLICATIONS

International Search Report and Written Opinion from PCT/US2020/059026 dated Mar. 15, 2021.

Japanese Application No. 2022-523362, Notice of Reasons for Rejection.

* cited by examiner

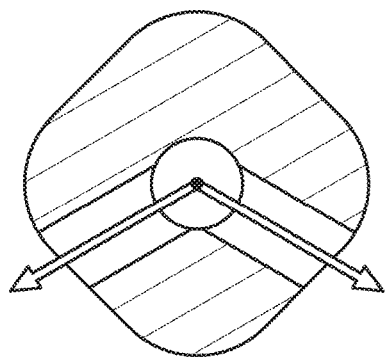
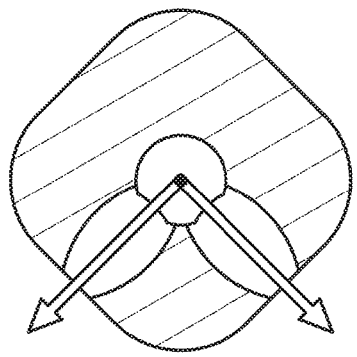
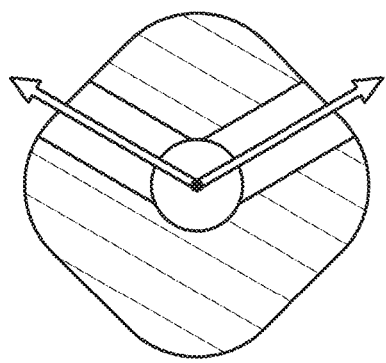
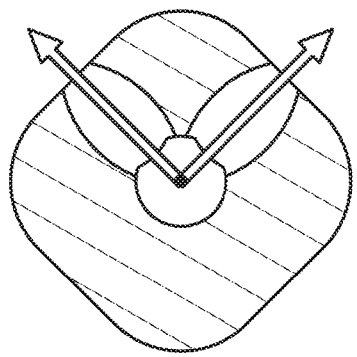
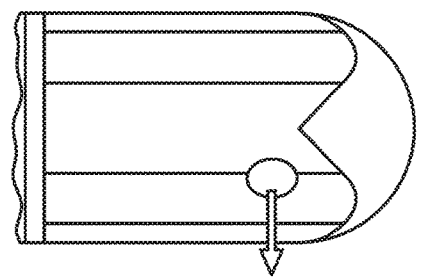
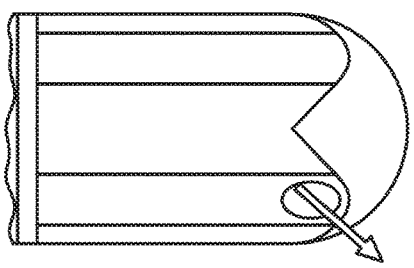
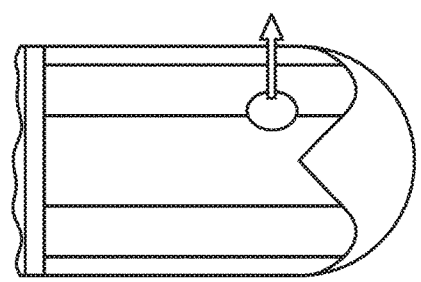
FIG.6A
FIG.6B
FIG.7A
FIG.7B

METHODS AND SYSTEMS OF ELECTROSURGICAL COAGULATION DEVICES

CROSS-REFERENCE TO RELATED APPLICATIONS

This application is a U.S. National Phase Entry of PCT Application Serial No. PCT/US2020/059026 filed Nov. 5, 2020 and titled "Methods and Systems of Electrosurgical Coagulation Devices." The PCT application is a conversion of U.S. Provisional App. No. 63/034,603 filed Jun. 4, 2020 titled "Methods and Systems of Electrosurgical Coagulation Devices." The PCT This application is also a conversion of U.S. Provisional App. No. 62/936,185 filed Nov. 15, 2019 titled "Bipolar Irrigating Electrosurgery." Both provisional applications and the PCT application are incorporated by reference herein as if reproduced in full below.

BACKGROUND

Coagulation devices, and in particular those used for arthroplasty, include saline delivery to the active tip of the device and to the tissue at the target site. The saline is delivered to create a pool of saline around the tip of the device at the site. The volume and distribution of saline around electrodes of the device, as well amount of saline delivered, is controlled to affect the width, breath, and aggressiveness of the coagulation.

SUMMARY

One example embodiment is a method of operating an electrosurgical coagulation device, the method comprising: applying radio frequency (RF) energy between a first electrode and a second electrode, the first electrode defines first longitudinal axis, the second electrode defines a second longitudinal axis coplanar with the first longitudinal axis, and the first and second electrodes define an interstice; flowing an electrically conductive fluid through a first nozzle and a second nozzle of the first electrode, the first nozzle defines a first spray direction, the second nozzle defines a second spray direction, and a first angle between the first spray direction and the second spray direction is 180 angular degrees (°) or less measured through the interstice; and flowing an electrically conductive fluid through a third nozzle and a fourth nozzle of the second electrode, the third nozzle defines a third spray direction, the fourth nozzle defines a fourth spray direction, and a second angle between the third spray direction and the fourth spray direction is 180° or less measured through the interstice.

In the example method: the first angle may be at least one selected from a group comprising: 170° or less; 120° or less; 90° or less; and 60° or less; and the second angle may be at least one selected from a group comprising: 170° or less; 120° or less; 90° or less; and 60° or less.

In the example method the first and second nozzles may be mirror images across the interstice of locations of the third and fourth nozzles, respectively.

In the example method, the first, second, third, and fourth spray directions may reside in a common plane.

In the example method: flowing the electrically conductive fluid through the first nozzle and the second nozzle may further comprise flowing with the first and second spray directions forming a first acute angle with respect to the first longitudinal axis, the first acute angle opens toward a target tissue; and flowing the electrically conductive fluid through the third nozzle and the fourth nozzle may further comprise flowing with the third and fourth spray directions forming a second acute angle with respect to the second longitudinal axis, the second acute angle opens toward the target tissue.

The example method may further comprise: contacting a target tissue with a rounded contact surface of the first electrode; and contacting the target tissue with a rounded contact surface of the second electrode. The rounded contact surface of the first electrode may be ellipsoidal, and the rounded contact surface of the second electrode may be ellipsoidal. The rounded contact surface of the first electrode may be spheroidal, and the rounded contact surface of the second electrode may be spheroidal.

In the example method applying RF energy may further comprise: accepting, at a controller for the electrosurgical coagulation device, an indication of a flow rate setting from a plurality of flow rate settings; accepting, at the controller, an indication of an applied voltage setting; providing energy to the first and second electrodes in a range of voltages determined by the applied voltage setting, the energy provided changes over time as a function of impedance experienced between the first and second electrodes; and pumping the electrically conductive fluid through the first through fourth nozzles, the flow rate selected by the controller from a table that relates the applied voltage setting and the flow rate setting, and the flow rate remains constant as the energy provided changes over time.

In the example method, the first longitudinal axis may be parallel to the second longitudinal axis.

Another example embodiment is an electrosurgical device, comprising: a handle having an irrigation lumen disposed therein; a cable coupled to a proximal end of the handle, the cable defining a first electrical conductor and a second electrical conductor; an elongate shaft coupled to the handle and defining a distal end opposite the handle; a first electrode disposed on the distal end of the elongate shaft and electrically coupled to the first electrical conductor, the first electrode defining a rounded contact surface opposite the distal end of the elongate shaft, a non-circular medial cross-section, and a first longitudinal axis; a second electrode disposed on the distal end of the elongate shaft and electrically coupled to the second electrical conductor, the second electrode defining a rounded contact surface opposite the distal end of the elongate shaft, a non-circular medial cross-section, and a second longitudinal axis that is coplanar with the first longitudinal axis; a first nozzle defined by the first electrode, the first nozzle fluidly coupled to the irrigation lumen, the first nozzle defining a first spray direction between and including 0 angular degrees (°) and 90° relative to a line that intersects both the first longitudinal axis the second longitudinal axis; and a second nozzle defined by the second electrode, the second nozzle fluidly coupled to the irrigation lumen, the second nozzle defining a second spray direction between and including 0° and 90° relative to the line.

The example electrosurgical device may further comprise: a third nozzle defined by the first electrode, the third nozzle fluidly coupled to the irrigation lumen, the third nozzle defining a third spray direction, the first spray direction and the third spray direction defining a first angle bisected by the line, and the first angle equal to or less than 180°; a fourth nozzle defined by the second electrode, the fourth nozzle fluidly coupled to the irrigation lumen, the forth nozzle defining a fourth spray direction, the second spray direction and the fourth spray direction defining a second angle bisected by the line, and the second angle equal to or less than 180°. The first angle may be at least one selected from a group comprising: 170° or less; 120° or less; 90° or less; and 60° or less; and the second angle may be at least one selected from a group comprising: 170° or less; 120° or less; 90° or less; and 60° or less. The orientation of the first and third nozzles may be mirror images of locations of the second and fourth nozzles, respectively, across an interstice between the first electrode and the second electrode.

In the example electrosurgical device, the first, second, third, and fourth spray directions may reside in a common plane.

The example electrosurgical device may further comprise: the first and third spray directions may form a first acute angle with respect to the first longitudinal axis, the first acute angle opens toward the rounded contact surface of the first electrode; and the second and fourth spray directions may form a second acute angle with respect to the second longitudinal axis, the second acute angle opens toward the rounded contact surface of the second electrode.

In the example electrosurgical device, the rounded contact surface of the first electrode may be ellipsoidal, and wherein the rounded contact surface of the second electrode may be ellipsoidal.

In the example electrosurgical device, the rounded contact surface of the first electrode may be spheroidal, and the rounded contact surface of the second electrode may be spheroidal.

In the example electrosurgical device, the first electrode may be rigidly coupled to the elongate shaft and immovable relative to the second electrode, and the second electrode may be rigidly coupled to the elongate shaft and immovable relative to the first electrode.

In the electrosurgical device, a line between an apex of the rounded contact surface of the first electrode and an apex of the rounded contact surface of the second electrode may be perpendicular to the first longitudinal axis of the first electrode.

In the example electrosurgical device, the first electrode and the second electrode each have a cross-section that is polygonal. The first electrode and the second electrode may each have a cross-section that is square.

In the example electrosurgical device, the first electrode and the second electrode may each have a cross-section that is square with a chamfered corner.

In the example electrosurgical device, the second longitudinal axis may be parallel to the first longitudinal axis.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a detailed description of example embodiments, reference will now be made to the accompanying drawings in which:

FIG. 6 shows both a front elevation view of the electrodes, as well as a cross-sectional view of the electrodes, in accordance with at least some embodiments;

FIG. 7 shows both a front elevation view of the electrodes, as well as a cross-sectional view of the electrodes, in accordance with at least some embodiments;

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Ellipsoidal" shall mean a surface defining three principle axes that intersect a center of symmetry. A surface that is "spheroidal" is subset of ellipsoidal in which the three principle axes are of equal length.

"Spray direction" of a nozzle shall refer to a direction that a column of saline initially moves as the fluid exits the nozzle. "Spray direction" shall not be read to require that the fluid is broken into droplets or atomized by the nozzle.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various example embodiments are directed to methods and systems of electrosurgical coagulation devices. In particular, example embodiments are directed to electrosurgical coagulation devices that have first and second electrodes disposed on a distal end of an elongate shaft, with the elongate shaft coupled to a handle. The electrodes are arranged to define an interstice between them, and radio frequency (RF) energy is applied across the electrodes in a bipolar manner to implement coagulation. Electrically conductive fluid emerges from nozzles in the electrodes, and in some cases the spray direction of the electrically conductive fluid from each electrode toward the other electrode to provide controlled wetting of the target tissue and controlled dispersion of the electrically conductive fluid. The specification first turns to an electrosurgical coagulation system to orient the reader.

Figure 1:
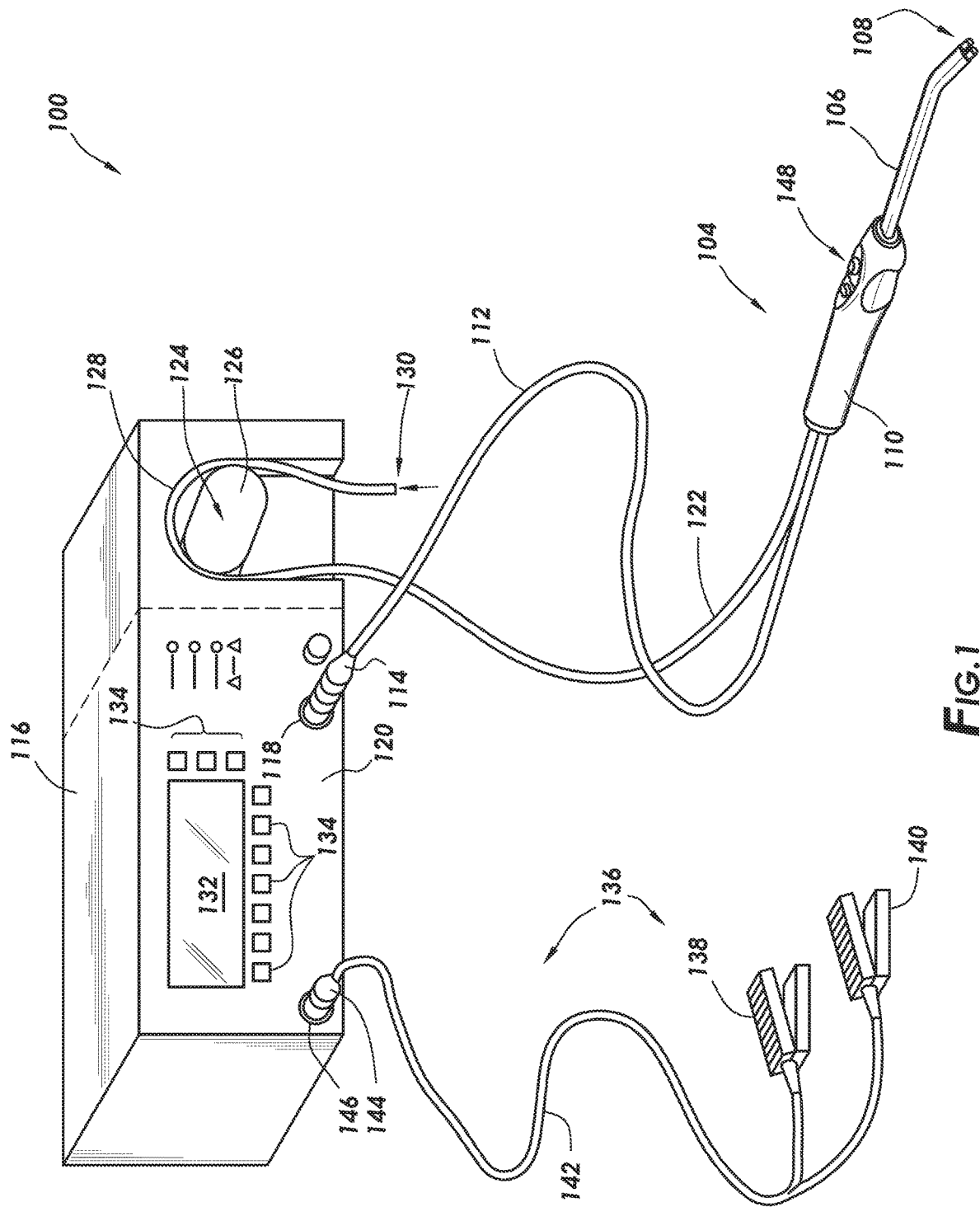
FIG. 1 shows an electrosurgical coagulation system in accordance with at least some embodiments.

FIG. 1 shows an electrosurgical coagulation system in accordance with at least some embodiments. In particular, the electrosurgical coagulation system 100 comprises an electrosurgical coagulation device 104 (hereafter just "device 104") that comprises an elongate shaft 106 defining a distal end 108. Further, the device 104 comprises a grip or handle 110 where a clinician holds the device 104 during surgical procedures. The device 104 further comprises a flexible multi-conductor cable 112 housing one or more electrical conductors or electrical leads (not specifically shown), and the flexible multi-conductor cable 112 terminates in a wand connector 114. As shown in FIG. 1, the device 104 is coupled to a coagulation controller 116, such as by a controller connector 118 on an outer surface of the enclosure 120 (in the illustrative case of FIG. 1, the front surface of the enclosure 120).

Though not visible in the view of FIG. 1, in some embodiments the device 104 has an internal flow channel or fluid irrigation lumen. The fluid irrigation lumen of the device 104 is coupled to a flexible tubular member 122 used to provide saline to the distal end 108 of the device 104. In accordance with example embodiments, the flexible tubular member 122 couples to a peristaltic pump 124, which peristaltic pump 124 is illustratively shown as an integral component with the coagulation controller 116 (i.e., residing at least partially within the enclosure 120 of the coagulation controller 116). In other embodiments, an enclosure for the peristaltic pump 124 may be separate from the enclosure 120 for the coagulation controller 116 (as shown by dashed lines in the figure).

The example peristaltic pump 124 comprises a rotor portion 126 (hereafter just "rotor 126") as well as a stator portion 128 (hereafter just "stator 128"). The flexible tubular member 122 is coupled within the peristaltic pump 124 between the rotor 126 and the stator 128, and movement of the rotor 126 against the flexible tubular member 122 causes fluid movement from the suction 130 toward the distal end 108 of the wand 102. While the illustrative peristaltic pump 124 is shown with a two-head rotor 126, other types of peristaltic pumps 124 may be used (e.g., a five-head peristaltic pump). In the context of the various embodiments, the peristaltic pump 124 creates a volume-controlled flow of electrically conductive fluid (e.g., saline, Ringers Solution) to the surgical field at the distal end 108 of the wand 104 (the surgical field not specifically shown). Hereafter, "electrically conductive fluid" will be referred as saline with the understanding that any suitable electrically conductive fluid may be used. The rate of flow of the saline is based on a speed of the rotor 126, as commanded by the coagulation controller 116. The suction 130 may be coupled to any suitable source of saline, such as in hanging bag or other container. In other cases, any pump system that provides volume controlled flow when activated (e.g., centrifugal pump with speed control) may be used.

Still referring to FIG. 1, a display device or interface device 132 is visible through the enclosure 120 of the coagulation controller 116, and in some embodiments a user may select operational modes of the coagulation controller 116 by way of the interface device 132 and related buttons 134. For example, using one or more of the buttons 134 the clinician may select a flow rate for the saline. As another example, using one or more of the buttons 134 the clinician may select an applied voltage setting to control the aggressiveness of the coagulation.

In some embodiments the electrosurgical coagulation system 100 also comprises a foot pedal assembly 136. The foot pedal assembly 136 may comprise one or more foot pedal devices 138 and 140, a flexible multi-conductor cable 142, and a pedal connector 144. While only two foot pedal devices 138 and 140 are shown, one or more pedal devices may be implemented. The enclosure 120 of the coagulation controller 116 may comprise a corresponding connector 146 that couples to the pedal connector 144. A clinician may use the foot pedal assembly 136 to control various aspects of the coagulation controller 116. For example, foot pedal device 138 may be used for on-off control application of RF energy to the distal end 108 of the device 104. Further, foot pedal device 140 may be used to control and/or set the flow of saline to the distal end 108 of the device 104. Alternatively, control of the various operational or performance aspects of the coagulation controller 116 (e.g., applied voltage setting) may be activated by selectively depressing the electrical switches or buttons 148 located on the handle 110 of the wand 102.

Figure 2:
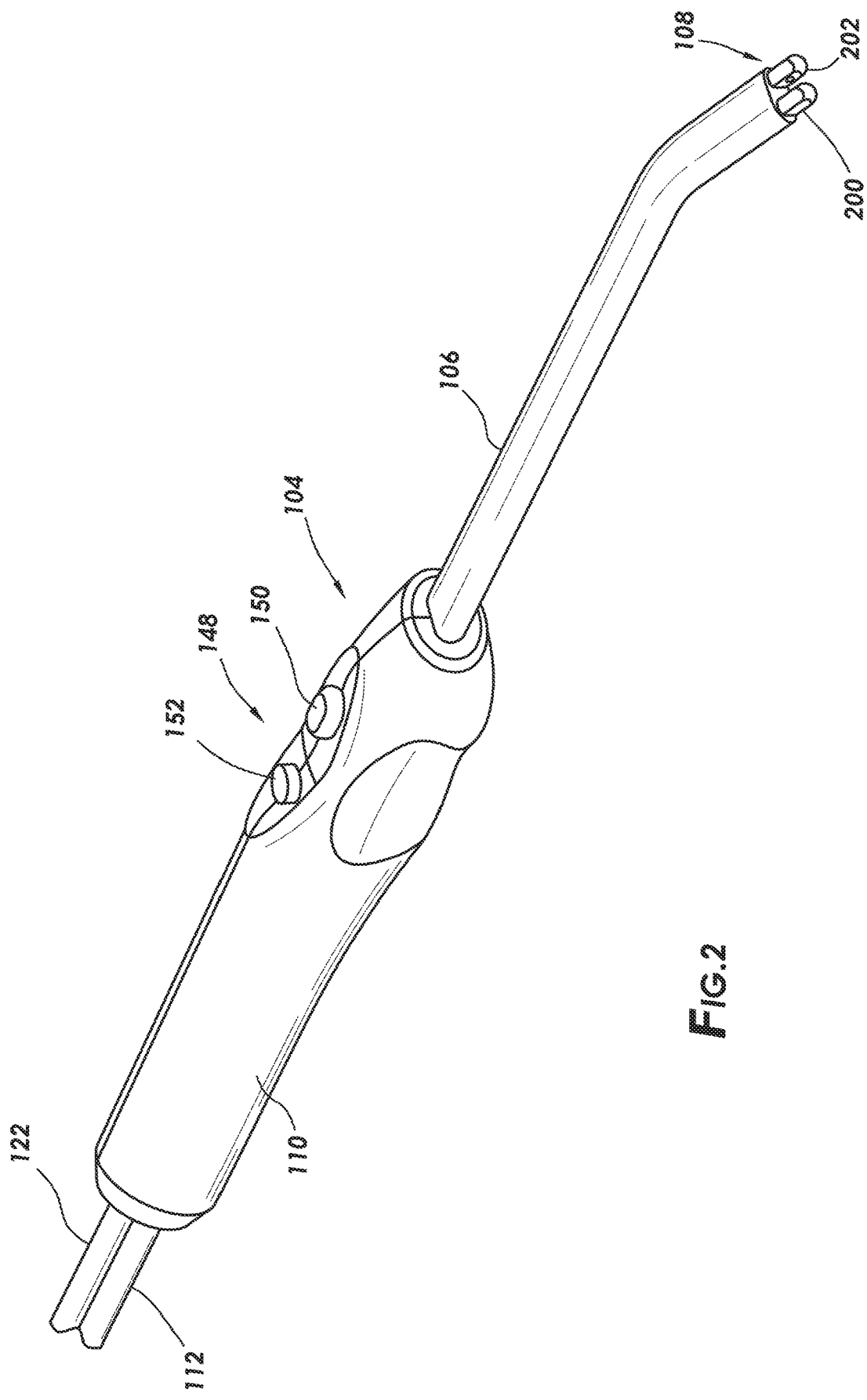
FIG. 2 shows a perspective view of a wand 102 in accordance with at least some embodiments.

FIG. 2 shows a perspective view of a device 104 in accordance with at least some embodiments. In particular, visible in FIG. 2 is the handle 110 as well as the elongate shaft 106 and distal end 108. Also visible in FIG. 2 are the buttons 148 that the clinician may use to control various aspects of the operation of the device 104 (e.g., on-off control, applied voltage setting, flow rate of saline). In particular, the button 150 may control on-off state of the coagulation, while the button 152 max control an increased coagulation function. Energy is delivered to the device 104 from the coagulation controller 116 (FIG. 1) by way of the flexible multi-conductor cable 112, and saline is delivered by way of the flexible tubular member 122. Better visible in FIG. 2 are the electrodes at the distal end 108 of the elongate shaft 106, being an electrode 200 and an electrode 202. Each electrode is a metallic structure defining a proximal end coupled to the elongate shaft 106 and an opposite distal end that, in operation, is close to or contacts tissue at the target site during electrosurgical coagulation procedures. As discussed further below, each electrode 200 and 202 defines an internal irrigating fluid path or flow lumen in operational relationship to one or more apertures or nozzles. Each nozzle defines a spray direction, and the saline exits each electrode by way of and in a direction controlled by the nozzle(s). In example embodiments, the nozzles are arranged on the electrodes such that fluid exits each electrode in a direction toward the other electrode.

Considering again the buttons 148, the example device 104 provides a temporary increased coagulation output to deal with an unexpected amount of blood in the surgical field. The buttons 148 on the handle 110 include the activation button 150 as well as the button 152, which may be referred to as "MAX button," and actuation of the button 152 results in increased coagulation (e.g., increased energy), but should not necessarily be read to require application the maximum amount of energy that the coagulation controller 116 (FIG. 1) can provide. When MAX button 152 is pressed, the device 104 instantaneously provides a temporary higher coagulating output to quickly address, for example, bleeding through large blood vessels. As illustrated, the more distal, larger button 150 may be the activation button, and the smaller, lower profile button proximally spaced from the button 150 is the MAX button 152.

In other cases, rather than employing two buttons 150 and 152, a single button can be used to supply both the selected treatment output and the increased output. For example, a single button may be activated one way to provide the treatment output and a different way to provide the increased output, such as by depressing the button into the handle for the treatment output and moving the button distally to activate the increased output. Alternatively, a rocker button may be employed. Inadvertent activation of the increased output can be reduced by making the action required to activate the increased output more intentional. For example, the user may have to press with more force to activate the increased output, and/or the position of the button may be spaced from the natural location of the clinician's fingers, and/or the size of the button may be smaller so the user has to actively find the button.

Figure 3A:
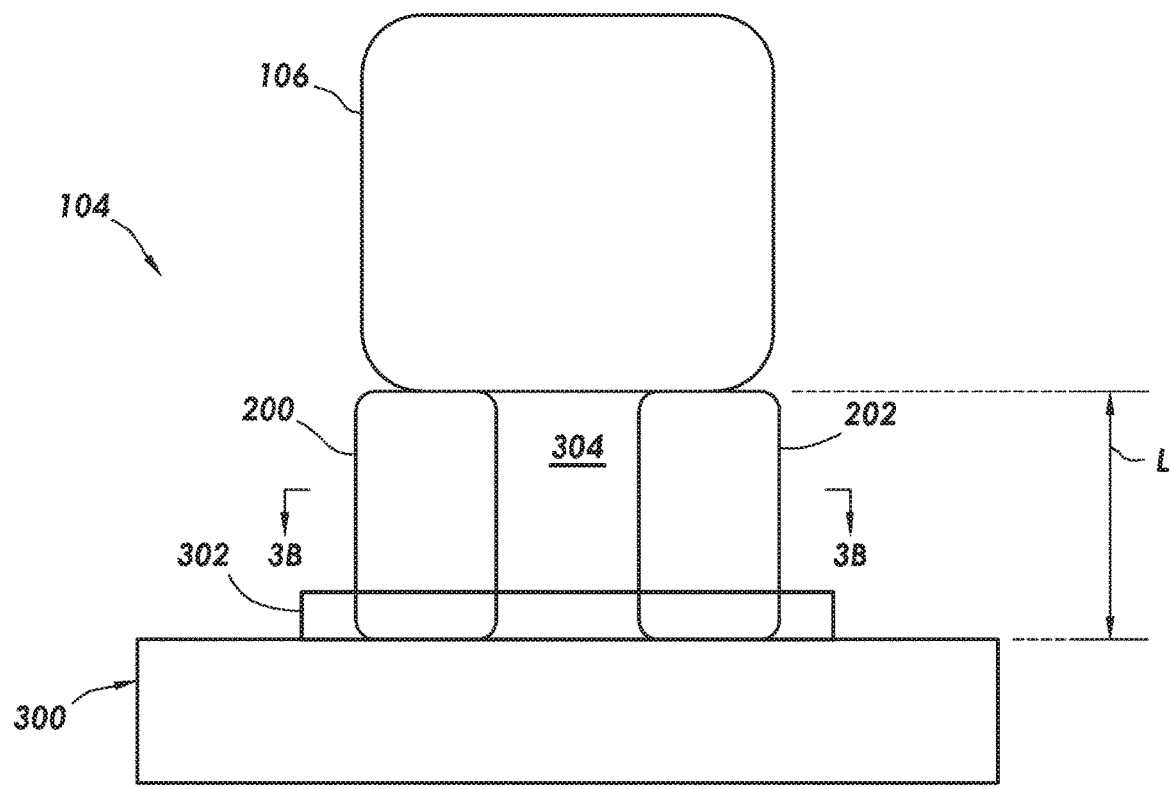
FIG. 3A shows, in block diagram form, an elevation view of a distal end of a device in contact with tissue, and in accordance with at least some embodiments.

FIG. 3A shows, in a simplified block diagram form, an elevation view of a distal end of a device 104 in contact with tissue at the target site, and in accordance with at least some embodiments. In particular, visible in FIG. 3A is a portion of the elongate shaft 106, the electrode 200, the electrode 202, as well as a portion of the tissue 300 at the target site. In example embodiments, the electrodes 200 and 202 are rigidly coupled, on their proximal ends, to the elongate shaft 106. Thus, in some cases the electrodes 200 and 202 are immovable with respect to each other and the elongate shaft 106. In example embodiments the electrodes 200 and 202 are spaced apart from each other, thus forming an area or interstitial space between the electrodes, referred to as interstice 304. Each electrode 200 and 202 defines an exposed length L measured from the distal end of the elongate shaft 106 to a distal end of each electrode, and in example cases the length L of each electrode is the same. As will be discussed in greater detail below, in some cases the distal end of each electrode is rounded, and the length L is measured to the bottom-most point of each electrode (if the electrodes are pointing down relative to force of gravity). Equivalently stated, in cases where distal end of each electrode is rounded, the length L is measured to the apex of each electrode (if the electrodes are pointing upward relative to the force of gravity).

Still referring to FIG. 3A, for effective operation saline is delivered into a concise volume 302 surrounding the electrodes 200 and 202, including within the interstice 304. In particular, the fluid delivery is enable by nozzles (not shown in FIG. 3A) on each electrode 200 and 20s arranged such that the spray direction of each nozzle delivers the saline between the electrodes, and also flows to fill the concise volume 302 around the electrodes 200 and 202. Delivery of saline in this way increases performance of the coagulation at the target site, and reduces the overall amount of saline used during the procedure.

In addition to the spray direction of each nozzle (discussed more below), the electrodes 200 and 202 are designed and constructed to enhance wetting within the concise volume 302, and particularly wetting of the electrodes 200 and 202. To this end, the electrodes 200 and 202 may have features on the exterior surfaces to direct the flow of saline. One example feature includes a hydrophobic or a hydrophilic surface treatment and/or coating on the electrodes 200 and 202. Another example feature is the fluid outlet geometry (e.g., spray direction of each nozzle) can be designed to disperse the fluid more effectively across the interstices 304, around the electrodes 200 and 202, and to fill the concise volume 302.

Improved wetting of the electrodes 200 and 202 reduces charring of the tissue at the target site, reduces charred tissue build up on the electrodes 200 and 202, and improves maneuverability of the device across the tissue 300 at the target site. In some cases, the distal surfaces of the electrodes 200 and 202 are designed to reduce contact with the tissue to enhance maneuverability of the device 104 across the target tissue. The planar surfaces on the sides of the electrodes of some embodiments increases the distance between the nozzles on one electrode and the nozzles on the other electrode, reducing bridging of electrical current between the electrodes through the saline.

Figure 3B:
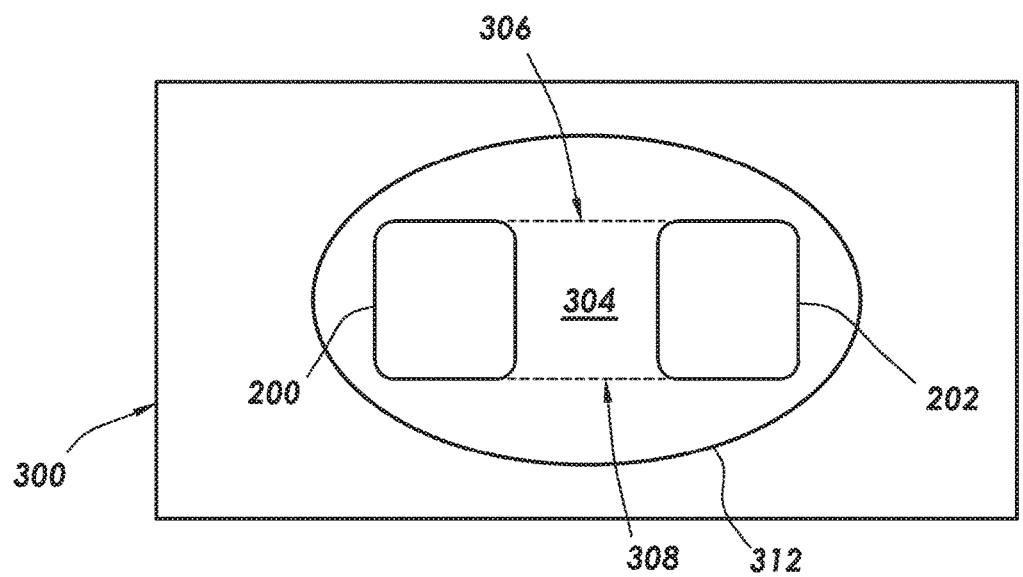
FIG. 3B shows a cross-sectional view of the electrodes taken substantially along line 3B-3B of FIG. 3A, and in accordance with at least some embodiments.

FIG. 3B shows a cross-sectional view of the electrodes taken substantially along line 3B-3B of FIG. 3A, and in accordance with at least some embodiments. In particular, visible in FIG. 3B is the electrode 200, the electrode 202, and the tissue 300 at the target site. As before, the electrodes 200 and 202 define the interstice 304. For the example electrodes 200 and 202, the interstice 304 is defined by the internally facing parallel walls and chamfered corners of the electrodes 200 and 202. However, and as will become more clear below, the interstices 304 may be defined by portions of each electrode 200 and 202 that face each other across the gap between the electrodes even if those surfaces are not parallel. Stated more precisely, the interstice 304 may be the area or volume between the electrodes 200 and 202 bounded by the projection of one electrode on the opposite electrode. In the example arrangement of FIG. 3B, the interstice 304 is bounded by the outward facing coplanar walls on each side of the electrodes, as shown by dashed lines 306 and 308. It follows, for example, that an example point 312 on the concise volume 302 would not be considered to reside within the interstice 304.

Figure 4A:
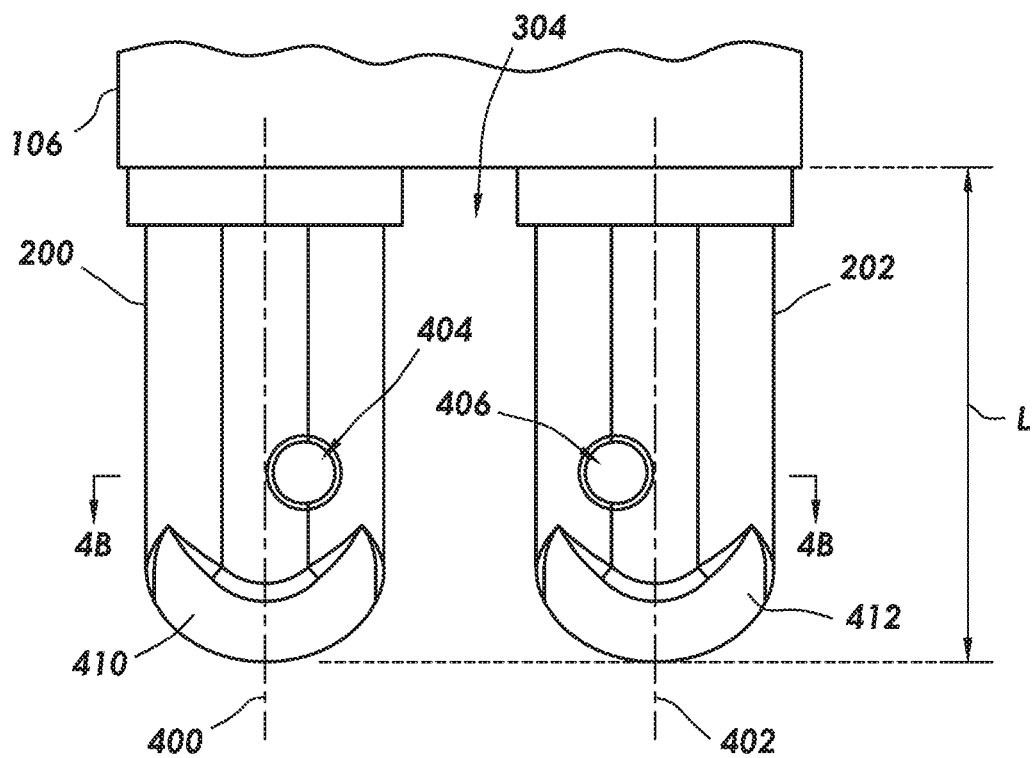
FIG. 4A shows a front elevation view of a distal end of a device in accordance with at least some embodiments.

FIG. 4A shows a front elevation view of a distal end of a device in accordance with at least some embodiments. In particular, visible in FIG. 4A is a portion of the elongate shaft 106, an example electrode 200, and an example electrode 202. As before, the example electrodes 200 and 202 are spaced apart from each other, thus forming the interstice 304. Each electrode 200 and 202 defines an exposed length L measured from the distal end of the elongate shaft 106 to a distal end of each electrode, and in example cases the length L of each electrode is the same. The example electrodes 200 and 202 each have a rounded distal end or contact surface 410 and 412, respectively (e.g., for contacting tissue at the target site during coagulation procedures). In some cases, each rounded contact surface may be ellipsoidal, and in particular cases contact surfaces may be spheroidal. In any event, the shape of the contact surfaces strike a balance between reducing contact area of each electrode 200 and 202 against the tissue at the target site, and reducing an amount of force used to move the electrodes along the tissue at the target site during use.

The example electrodes 200 and 202 each define a longitudinal central axis. In particular, the electrode 200 defines a longitudinal central axis 400. Similarly, the electrode 202 defines a longitudinal central axis 402. In the example arrangement, the longitudinal central axes 400 and 402 are coplanar. In the specific case shown, the longitudinal central axes 400 and 402 are parallel. However, in other cases the longitudinal central axes 400 and 402 may be coplanar but not parallel. For example, the electrodes may splay outward or open outward relative to the elongate shaft 106, which increases the volume of the interstice 304. In yet still other cases, the electrodes may be tilted inward relative to the elongate shaft 106, which decreases the volume of the interstice 304. There may be operational advantages to each of the splay and tilted arrangement, though the operational advantages may not be the same.

Also visible in FIG. 4A are nozzles on each of the electrodes. In particular, visible in FIG. 4A is an aperture or nozzle 404 exposed on an outer surface of the electrode 200, and aperture or nozzle 406 exposed on an outer surface of the electrode 202. The example nozzle 404 is off-center with respect to the electrode 200, and in particular an outer wall of the nozzle 404 is aligned with the longitudinal central axis 400 such that nozzle 404 is closer to the interstice 304. Stated otherwise, the nozzle 404 is on the interstitial side of the longitudinal central axis 400. Similarly, the example nozzle 406 is off-center with respect to the electrode 202, and in particular an outer wall of the nozzle 406 is aligned with the longitudinal central axis 402 such that nozzle 406 is closer to the interstice 304. Stated otherwise, the nozzle 406 is on the interstitial side of the longitudinal central axis 402. The example nozzle 404 is fluidly coupled to a flow lumen within the electrode 200 (not visible), which is fluidly coupled to an irrigation lumen within the handle 110 (FIG. 1), which is fluidly coupled to the peristaltic pump 124 (FIG. 1) and a source of saline. Thus, during use saline exits from within the electrode 200 by way of nozzle 404. Similarly, the example nozzle 406 is fluidly coupled to a flow lumen within the electrode 202 (not visible), which is fluidly coupled to an irrigation lumen within the handle 110 (FIG. 1), which is fluidly coupled to the peristaltic pump 124 (FIG. 1) and the source of saline. Thus, during use saline exits from within the electrode 202 by way of nozzle 404.

Figure 4B:
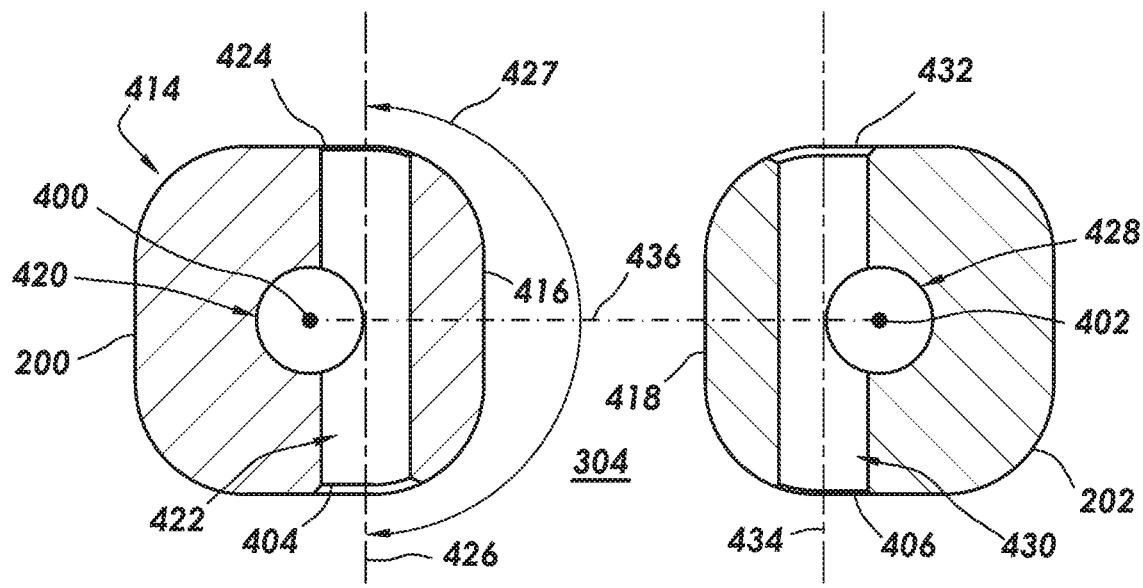
FIG. 4B shows a cross-sectional view of the electrodes taken substantially along lines 4B-4B of FIG. 4A.

FIG. 4B shows a cross-sectional view of the electrodes taken substantially along line 4B-4B of FIG. 4A, and in accordance with at least some embodiments. In particular, the view FIG. 4B is a medial cross-sectional view, and visible in FIG. 4B is the electrode 200 and the electrode 202. As before, the electrodes 200 and 202 define the interstice 304. FIG. 4B better shows that each example electrodes is a polygon, and particularly each electrode is a square having chamfered corners (e.g., chamfer 414). In the example case of FIG. 4B, the electrodes 200 and 202 are arranged about their respective longitudinal central axes such that the interior facing wall 416 of electrode 200 is parallel to the interior facing wall 418 of electrode 202, though other arrangement are possible.

Also visible in FIG. 4B are examples of internal flow path or flow lumen within each electrode. Referring initially to electrode 200, the flow lumen within the electrode 200 comprises a blind bore 420 that is coaxial with longitudinal central axis 400. The blind bore 420 is referred to as "blind" in the sense that the bore is created in such a way to be open at the proximal end of the electrode (e.g., to be fluidly coupled to the irrigation lumen within the handle 110 (FIG. 1)), but the blind bore does not proceed all the way through the electrode 200 (i.e., the bore does not create an aperture through the contact surface 410). Moreover, though referred to as a bore, the blind bore 420 may be created using any suitable method (e.g., boring, laser drill, casting, and milling). At the elevation of the nozzles, the example flow lumen within the electrodes 200 also comprises a through-bore 422. The example through-bore 422 thus defines nozzle 404, as well as nozzle 424 on the opposite side of the through-bore 422. The through-bore 422 may be created in any suitable way (e.g., boring, laser drill, casting, and milling). In operation, saline flows through the irrigation lumen of the handle 110 (FIG. 1), along a flow lumen within the elongate shaft 106 (FIG. 4A), then through the blind bore 420. The flow of saline then splits into two streams at the intersection of the blind bore 420 and the through-bore 422, and each stream exits the electrode 200 through the respective nozzle 404 or 424.

The example through-bore 422 defines a central axis 426. The spray direction for nozzle 404 is coaxial with the central axis 426. Similarly, the spray direction for nozzle 424 is coaxial with the central axis 426, but in the example case of FIG. 4B the spray direction for nozzle 424 is in an opposite direction from the spray direction for nozzle 404. Stated differently, an angle between the spray direction for nozzle 404 and the spray direction for nozzle 424 is 180 angular degrees (°) measured through the interstice 304, the angle show by double-headed arrow 427.

Now referring to electrode 202, the flow lumen within the electrode comprises a blind bore 428 that is coaxial with longitudinal central axis 402. The blind bore 428 is referred to as "blind" for the same reasons as discussed with respect to electrode 200, and may be created using any suitable method. At the elevation of the nozzles, the example flow lumen within the electrodes 202 also comprises a through-bore 430. The example through-bore 430 thus defines nozzle 406, as well as nozzle 432 on the opposite side of the through-bore 430. The through-bore 422 may likewise be created in any suitable way. In operation, saline flows through the fluid irrigation lumen of the handle 110 (FIG. 1), along a flow lumen within the elongate shaft 106 (FIG. 4A), then through the blind bore 428. The flow of saline then splits into two streams at the intersection of the blind bore 428 and the through bore 430, and each stream exits the electrode 202 through the respective nozzle 406 or 432.

The example through-bore 430 also defines a central axis 434. The spray direction for nozzle 406 is coaxial with the central axis 434. Similarly, the spray direction for nozzle 432 is coaxial with the central axis 434, but in the example case of FIG. 4B the spray direction for nozzle 432 is in an opposite direction from the spray direction for nozzle 404. Stated differently, an angle between the spray direction for nozzle 406 and the spray direction for nozzle 432 is 180° measured through the interstice 304. It follows that in the example case of FIG. 4B the locations of the nozzles 406 and 432 are mirror images across the interstice 304 of locations of the nozzles 404 and 424, respectively.

The relationship of the nozzles of the FIG. 4B is merely an example, and the angle between nozzles of an electrode may take many suitable forms. For example, and referring to electrode 200 as representative, the through-bore 422 may in other cases be implemented a two separate bores that enter the electrode at an angle, yet nevertheless intersect the blind bore 420. When implemented in this way, the angle between nozzle 404 and nozzle 424 may be less than 180°, in some cases 170° or less, in other cases 120° or less, in other cases 90° or less, and in yet still further cases 60° or less. Stated more geometrically, each bore may have a central axis, and yet an angle between the central axis for a first bore and the central axis for a second bore may be less than 180°, including any of the angles less than 180° given within this paragraph.

Still referring to FIG. 4B, the angles with respect to the nozzles may be equivalently expressed as an angle between the spray direction of a nozzle and an imaginary line that intersects the longitudinal central axes of the electrodes. Consider, as an example, line 436 that interests both the longitudinal central axis 400 and the longitudinal central axis 402. When considered this way, the angle between nozzle 404 as a representative example and the line 436 may be less than 90°, in some cases 85° or less, in other cases 60° or less, in other cases 45° or less, and in yet still further cases 30° or less. In one special case of a single nozzle implemented on each electrode, the angle may be 0°. The explanation with respect to nozzle 404 is equally applicable to nozzles 406, 424, and 432.

Referring simultaneously to FIGS. 4A and 4B, for the example electrodes shown, the spray directions for the nozzles 404, 424, 406, and 432 all reside in a common plane. When the longitudinal central axes 400 and 402 are parallel, the common plane is also perpendicular to the longitudinal central axes 400 and 402. In other cases, however, the spray directions for each nozzle need not be coplanar.

Figure 4C:
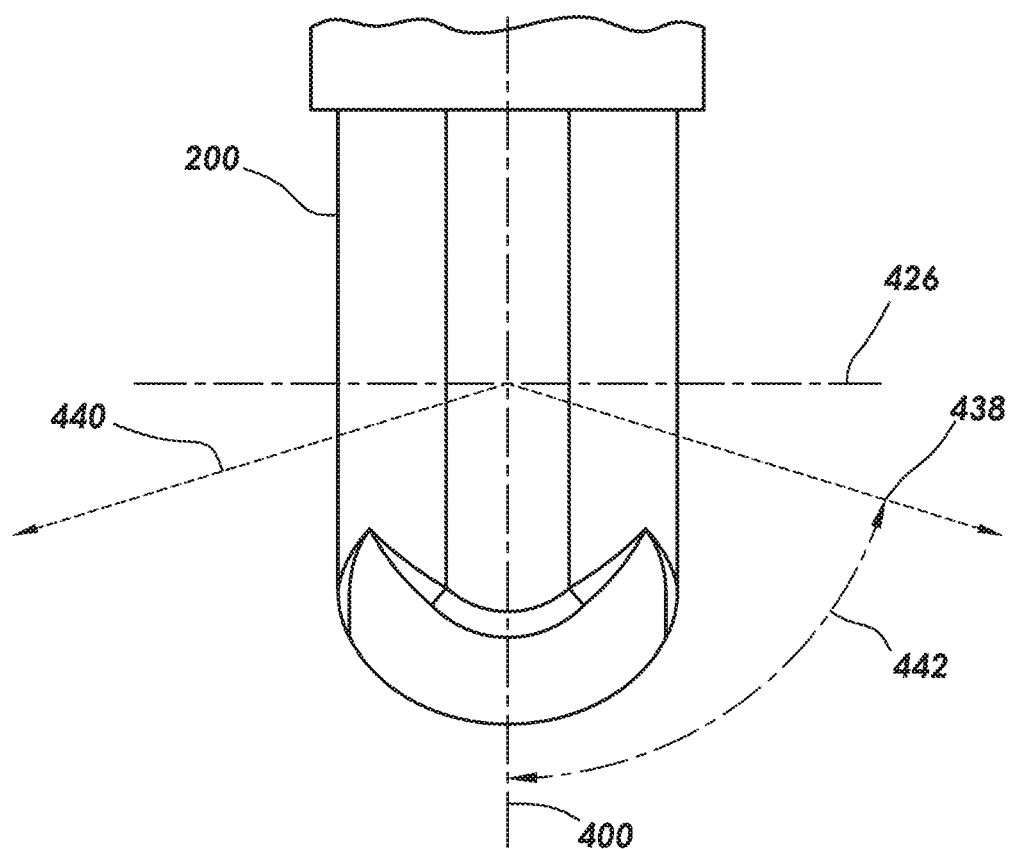
FIG. 4C shows a side elevation view of an electrode in accordance with at least some embodiments.

FIG. 4C shows a side elevation view of an electrode in accordance with at least some embodiments. In particular, FIG. 4C shows a view of electrode 200 looking toward electrode 202, but electrode 202 is not visible. Also shown in FIG. 4C is the longitudinal central axis 400 of electrode 200, along with the central axis 426 in the example case where the spray directions are coplanar. However, in yet still further embodiments the spray directions need not be coplanar, and in fact can be angled toward the distal ends of the electrodes. FIG. 4C shows line 438 and line 440 representing alternative spray directions for nozzles 404 and 424 (FIGS. 4A and 4B), respectively. Stated equivalently, lines 438 and 440 represent the central axis of bores of the electrode that define the internal flow lumens and corresponding nozzles. In the example case, each of the spray directions represented by lines 438 and 440 form an acute angle with respect to the longitudinal central axis 400, such as shown by double-headed arrow 442, the acute angle opening toward the rounded contact surface of the electrode 200. In some cases, and as shown, the angles are the same, but in other cases the angles may be different. Though electrode 202 is not visible in FIG. 4C, the spray angles associated with the nozzles of electrode 202 may make similar acute angles with respect to the longitudinal central axis 402 the electrode 202.

Figure 5A:
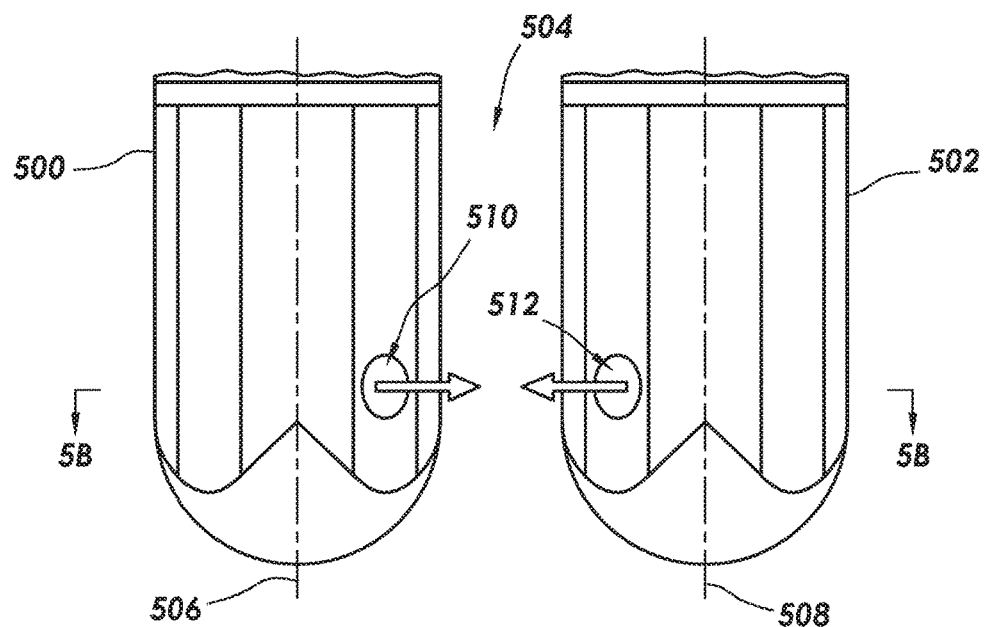
FIG. 5A shows a front elevation view of a distal end of a device in accordance with at least some embodiments.

FIG. 5A shows a front elevation view of a distal end of a device in accordance with at least some embodiments. In particular, visible in FIG. 5A is an example electrode 500 and an example electrode 502. As before, the example electrodes 500 and 502 are spaced apart from each other, thus forming the interstice 504. The electrodes 500 and 502 each have a rounded distal end or contact surface, which may be ellipsoidal or spheroidal. The example electrodes 500 and 502 each define a longitudinal central axis 506 and 508, respectively. In the example arrangement, the longitudinal central axes 506 and 508 are coplanar and parallel. However, in other cases the longitudinal central axes 506 and 508 may be coplanar but not parallel.

Also shown in FIG. 5A are nozzles on each of the electrodes. In particular, visible in FIG. 5A is an aperture or nozzle 510 exposed on an outer surface of the electrode 500, and aperture or nozzle 512 exposed on an outer surface of the electrode 502. The example nozzle 510 is fluidly coupled to a flow lumen within the electrode 200, which is fluidly coupled to an irrigation lumen within the handle 110 (FIG. 1), which is fluidly coupled to the peristaltic pump 124 (FIG. 1) and a source of saline. Thus, during use saline exits from within the electrode 500 by way of nozzle 510. Similarly, the example nozzle 512 is fluidly coupled to a flow lumen within the electrode 202, which is fluidly coupled to an irrigation lumen within the handle 110 (FIG. 1), which is fluidly coupled to the peristaltic pump 124 (FIG. 1) and the source of saline. Thus, during use saline exits from within the electrode 502 by way of nozzle 512.

Figure 5B:
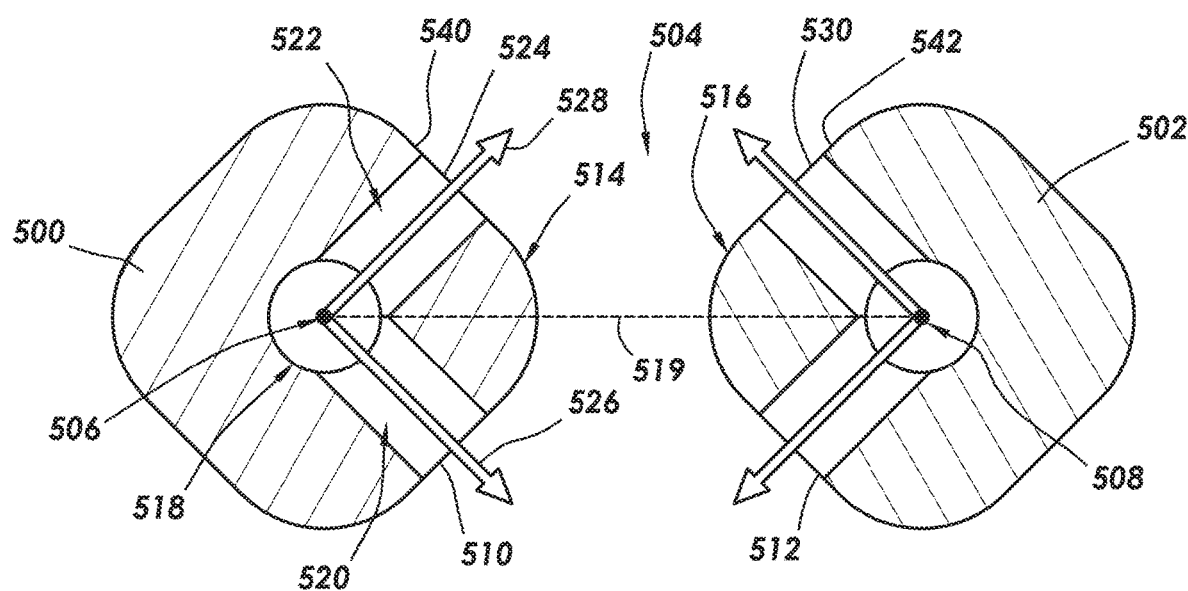
FIG. 5B shows a cross-sectional view of the electrodes taken substantially along line 5B-5B of FIG. 5A, and in accordance with at least some embodiments.

FIG. 5B shows a cross-sectional view of the electrodes taken substantially along line 5B-5B of FIG. 5A, and in accordance with at least some embodiments. In particular, visible in FIG. 5B is the electrode 500 and the electrode 502. As before, the electrodes 500 and 502 define the interstice 504. FIG. 5B better shows that each example electrodes is a polygon, and particularly each electrode is a square having chamfered corners (e.g., chamfer 514). In the example case of FIG. 5B, the electrodes 500 and 502 are arranged about their respective longitudinal central axes such that the interior facing chamfer 514 of electrode 500, as well as the interior facing chamfer 516 of electrode 502, are bisected by a line 519 extending between the longitudinal central axes 506 and 508. Equivalently stated, the flat side wall 540 of electrode 500 resides in a plane, the flat side wall 542 resides in a plane, and the planes are perpendicular.

Also visible in FIG. 5B are examples of the internal flow path or the flow lumen within each electrode. For example, electrode 500 defines a blind bore 518 that is coaxial with longitudinal central axis 506. The blind bore 518 may be created using any suitable method (e.g., boring, laser drill, casting, and milling). At the elevation of the nozzles, the example flow lumen within the electrode 500 also comprises a bore 520 and bore 522. The example bore 520 defines nozzle 510, and the example bore 522 defines nozzle 524. The bores 520 and 522 may be created in any suitable way (e.g., boring, laser drill, casting, and milling). In operation, saline flows through the irrigation lumen of the handle 110 (FIG. 1), along a flow lumen within the elongate shaft 106, then through the blind bore 518. The flow of saline then splits into two streams at the intersection of the blind bore 518 with the bores 520 and 522, and each stream exits the electrode 500 through the respective nozzle 510 or 524.

The example bore 520 defines a central axis 526, and the spray direction for nozzle 510 is coaxial with the central axis 526. The example bore 522 defines a central axis 528, and the spray direction for nozzle 524 is coaxial with the central axis 528. An angle between the spray direction for nozzle 510 and the spray direction for nozzle 524 is 90° or less measured through the interstice 504, and in some cases 60° or less. The example electrode 502 has mirror set of components, including a blind bore, bores that intersect the blind bore, and nozzles with spray directions. The various components of the mirror set are not specifically numbered and discussed so as not to unduly lengthen the specification.

Still referring to FIG. 5B, the angles with respect to the nozzles may be equivalently expressed as an angle between the spray direction of a nozzle and the line 519 that intersects the longitudinal central axes of the electrodes. When considered this way, the angle between the spray direction of nozzle 510 and the line 519 may be less than 45°, and in some cases 22.5° or less. In one special case of a single nozzle implemented on each electrode, the angle may be 0° relative to the line 519 (e.g., the spray direction may be coaxial with the line 519). The explanation with respect to nozzle 510 is equally applicable to nozzles 512, 524, and 530. The spray directions for the nozzles 510 and 512 may all reside in a common plane, or in other cases may form an acute angle with respect to the longitudinal central axis 506, opening toward the rounded contact surfaces. The spray directions for the nozzles 512 and 530 may all reside in a common plane, or in other cases may form an acute angle with respect to the longitudinal central axis 508, opening toward the rounded contact surfaces.

FIG. 6 shows both a front elevation view of the electrodes, as well as a cross-sectional view of the electrodes, in accordance with at least some embodiments. In particular, portion 600 is a front elevation view of the electrodes, and portion 602 shows a cross-sectional view through the nozzles of the electrodes of portion 600. Many components and relationships of the electrodes of FIG. 6 are the same as discussed with respect to FIGS. 4A-4C and 5A-5B above, and will not be repeated again here so as not to unduly lengthen the specification. FIG. 6 shows, however, that spray directions for the nozzles, in cases where chamfered corners face each other across the interstice, need not be perpendicular to the faces of the electrodes within which the nozzles are defined. In the example case of FIG. 6, the angle between the spray directions (measured through the interstice) of the nozzles of an electrode may be 120° or less. Again, as shown the spray directions are all coplanar.

FIG. 7 shows both a front elevation view of the electrodes, as well as a cross-sectional view of the electrodes, in accordance with at least some embodiments. In particular, portion 700 is a front elevation view of the electrodes, and portion 702 shows a cross-sectional view through the nozzles of the electrodes of portion 700. Many components and relationships of the electrodes of FIG. 7 are the same as discussed with respect to FIGS. 4A-4C and 5A-5B above, and will not be repeated again here so as not to unduly lengthen the specification. FIG. 7 expressly shows, however, an example situation in which the spray directions for the nozzles are angled downward toward the rounded contact surfaces. Stated otherwise, FIG. 7 shows an example situation in which the spray directions form an acute angle with the respective longitudinal central axes (not specifically shown), in some cases the acute angle is 60° or less, and in other cases the acute angle is 30° or less. Stated otherwise, the example nozzles may form, for example, an angle of 30° or more from horizontal, and in other cases 60° or more from horizontal.

Figure 8A:
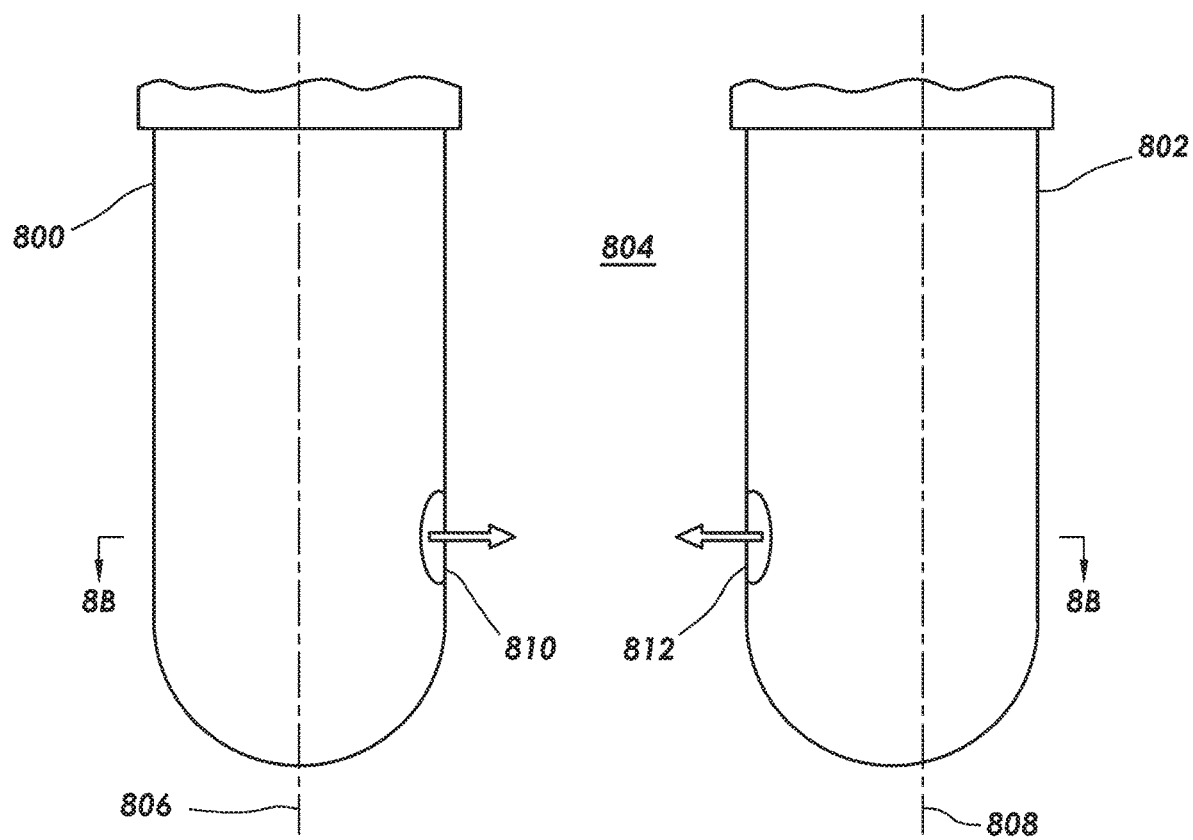
FIG. 8A shows a front elevation view of a distal end of a device in accordance with at least some embodiments.

FIG. 8A shows a front elevation view of a distal end of a device in accordance with at least some embodiments. In particular, visible in FIG. 8A is an example electrode 800 and an example electrode 802. Many components and relationships of the electrodes of FIGS. 8A (and 8B) are the same as discussed with respect to FIGS. 4A-4C and 5A-5B above, and will not be repeated again here so as not to unduly lengthen the specification. As before, the example electrodes 800 and 802 are spaced apart from each other, thus forming the interstice 804. The example electrodes 800 and 802 each have a rounded distal end or contact surface, each of which may be ellipsoidal, and in some cases spheroidal.

The example electrodes 800 and 802 each define a longitudinal central axis. In particular, the electrode 800 defines a longitudinal central axis 806, and the electrode 802 defines a longitudinal central axis 808. In the example arrangement, the longitudinal central axes 806 and 808 are coplanar and parallel. However, in other cases the longitudinal central axes 400 and 402 may be coplanar but not parallel. Also visible in FIG. 8A are nozzles on each of the electrodes. In particular, visible in FIG. 8A is an aperture or nozzle 810 exposed on an outer surface of the electrode 800, and aperture or nozzle 812 exposed on an outer surface of the electrode 802. The example nozzle 810 is fluidly coupled to an flow lumen within the electrode 800. Similarly, the example nozzle 812 is fluidly coupled to a flow lumen within the electrode 802.

Figure 8B:
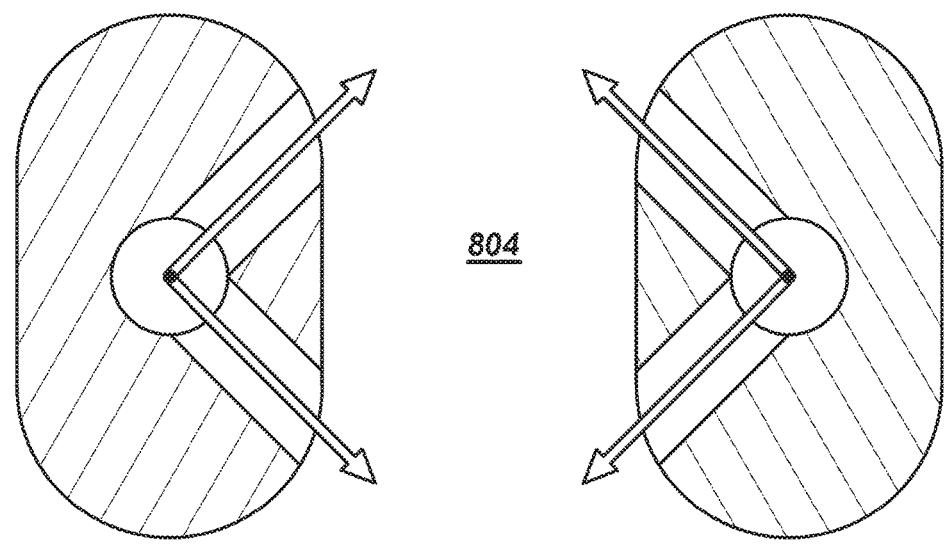
FIG. 8B shows a cross-sectional view of the electrodes taken substantially along line 8B-8B of FIG. 8A, and in accordance with at least some embodiments.

FIG. 8B shows a cross-sectional view of the electrodes taken substantially along line 8B-8B of FIG. 8A, and in accordance with at least some embodiments. In particular, FIG. 8B shows that the cross-sectional shape of the example electrodes need not be polygonal, and in fact may be in the form of a closed curve with at least one axis of symmetry. As shown, the cross-sectional shape is that of an ovoid, and in particular an oval, but other closed-curve shapes may be implemented. Each example oval has a long wall, and in the example shown long walls facing the interstice 804 are parallel. While FIG. 8B illustrates an angle between the spray directions of the nozzles to be about 90°, the spray directions of the nozzles may take any suitable angle, for example, 180° or less.

Figure 9A:
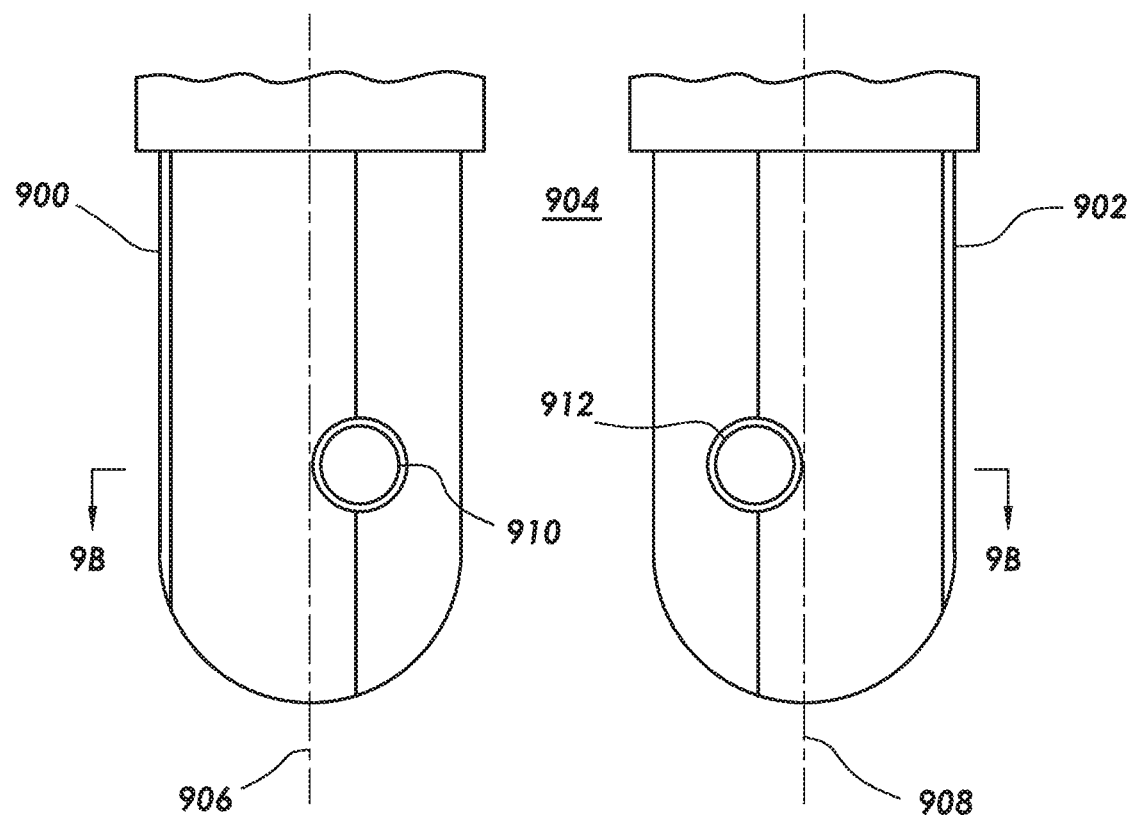
FIG. 9A shows a front elevation view of a distal end of a device in accordance with at least some embodiments.

FIG. 9A shows a front elevation view of a distal end of a device in accordance with at least some embodiments. In particular, visible in FIG. 9A is an example electrode 900 and an example electrode 902. Many components and relationships of the electrodes of FIGS. 9A (and 9B) are the same as discussed with respect to FIGS. 4A-4C and 5A-5B above, and will not be repeated again here so as not to unduly lengthen the specification. As before, the example electrodes 900 and 902 are spaced apart from each other, thus forming the interstice 904. The example electrodes 900 and 902 each have a rounded distal end or contact surface, each of which may be ellipsoidal, and in some cases spheroidal.

The example electrodes 900 and 902 each define a longitudinal central axis. In particular, the electrode 900 defines a longitudinal central axis 906, and the electrode 902 defines a longitudinal central axis 908. In the example arrangement, the longitudinal central axes 906 and 908 are coplanar and parallel. However, in other cases the longitudinal central axes 906 and 908 may be coplanar but not parallel. Also visible in FIG. 9A are nozzles on each of the electrodes. In particular, visible in FIG. 9A is an aperture or nozzle 910 exposed on an outer surface of the electrode 900, and aperture or nozzle 912 exposed on an outer surface of the electrode 902. The example nozzle 910 is fluidly coupled to a flow lumen within the electrode 900. Similarly, the example nozzle 912 is fluidly coupled to a flow lumen within the electrode 902.

Figure 9B:
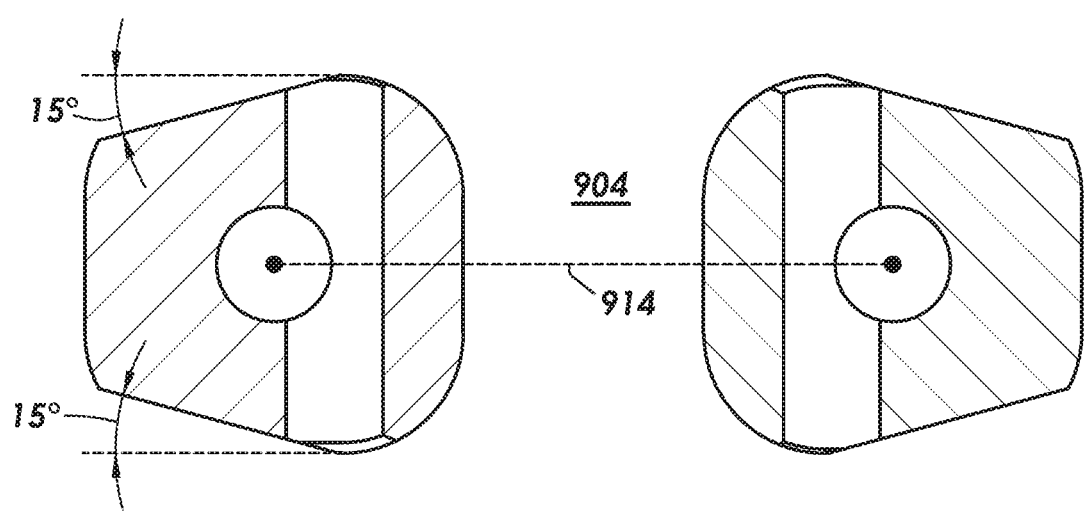
FIG. 9B shows a cross-sectional view of the electrodes taken substantially along line 9B-9B of FIG. 9A, and in accordance with at least some embodiments.

FIG. 9B shows a cross-sectional view of the electrodes taken substantially along line 9B-9B of FIG. 9A, and in accordance with at least some embodiments. In particular, FIG. 9B shows that the cross-sectional shape of the example electrodes need not have two axis symmetry. In the example case shown, the cross-sectional shapes are polygonal with chamfered corners, and in particular are convex polygonal with the smaller portions pointing away from the interstice 904. As shown, the smaller portions form the angle is about 15° with parallel tangent lines at the locations of the nozzles. Stated otherwise, each electrode has a cross-sectional shape that is a convex polygon with one axis of symmetry, where the axis of symmetry is parallel or coaxial with a line 914 connecting the longitudinal central axes. The example cross-sectional shape of FIG. 9B may help direct the flow of saline to the outer perimeter of the electrodes to help the wetting process.

Figure 10A:
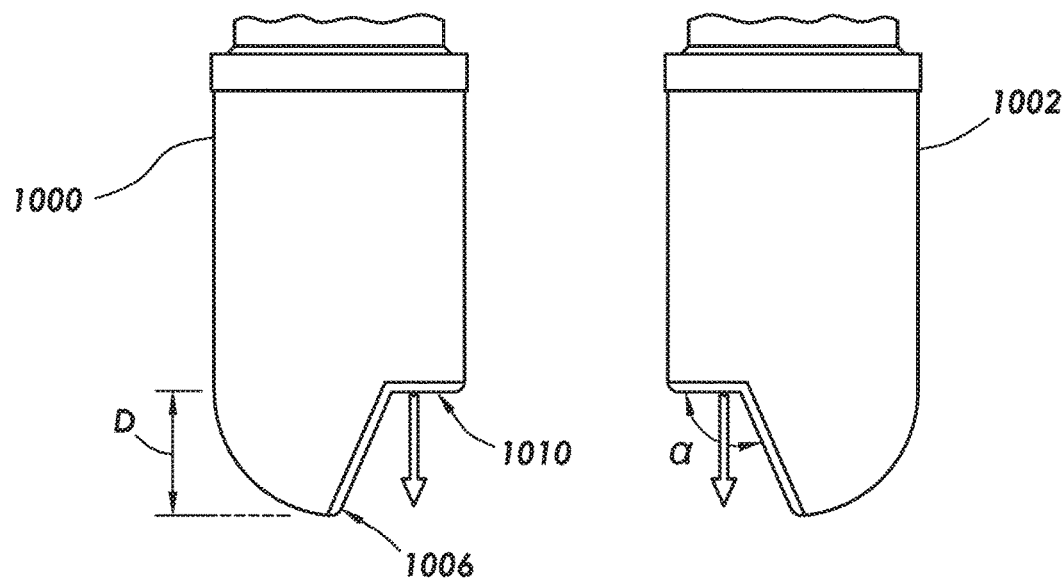
FIG. 10A shows a front elevation view of electrodes in accordance with at least some embodiments.
Figure 10B:
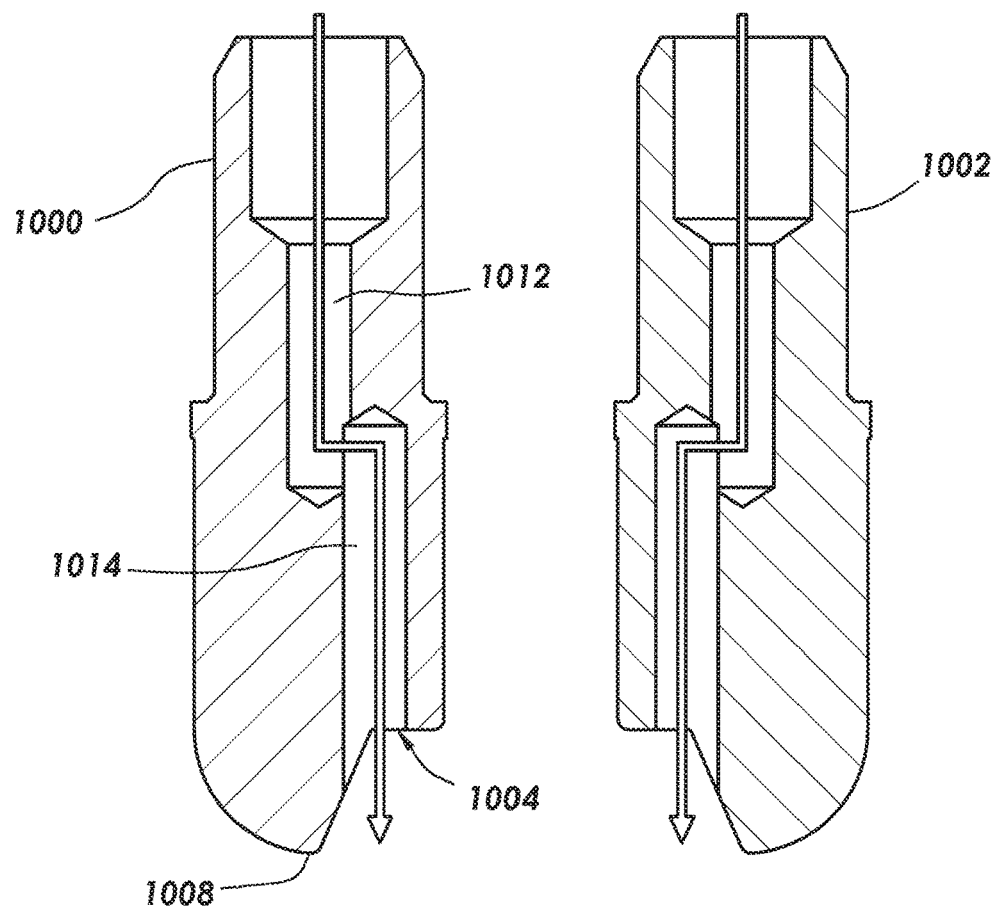
FIG. 10B shows a cross-sectional view of the electrodes of FIG. 10A, in accordance with at least some embodiments.
Figure 10C:
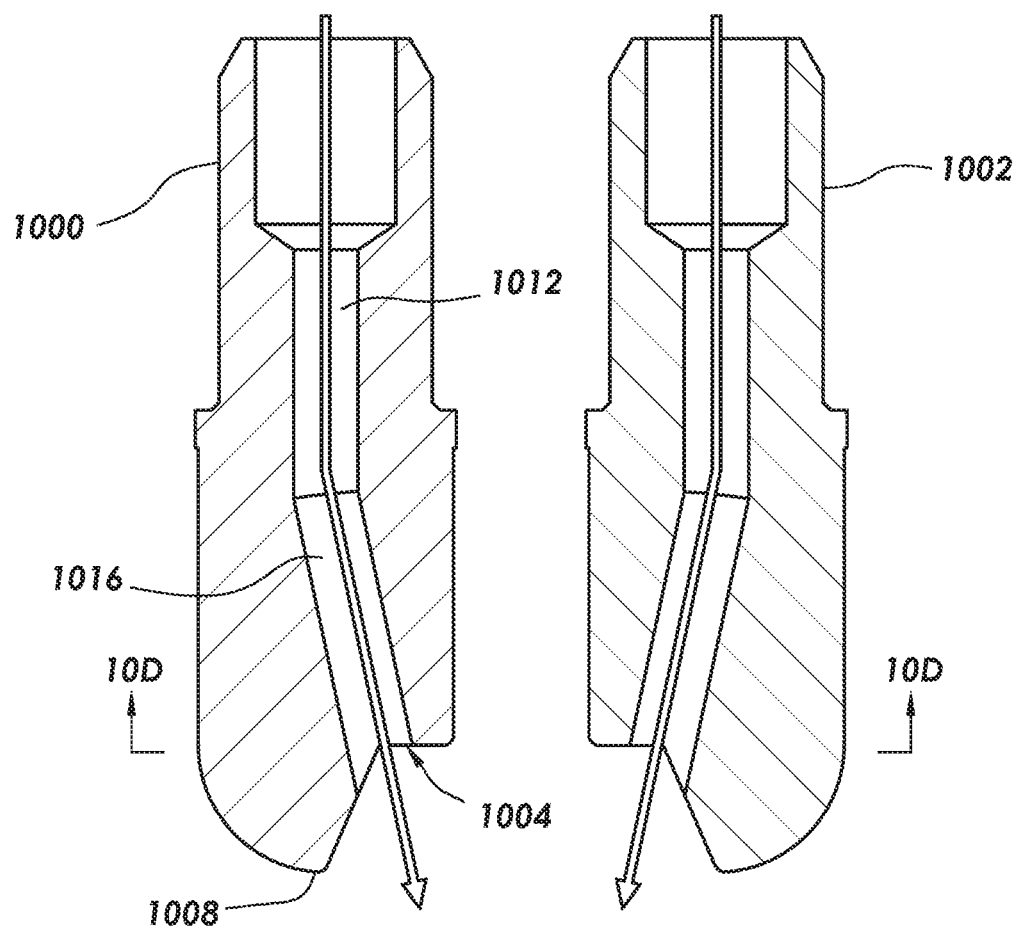
FIG. 10C shows a cross-sectional view of electrodes in which the spray direction forms an acute angle with the longitudinal central axis of the electrodes, and in accordance with at least some embodiments.
Figure 10D:
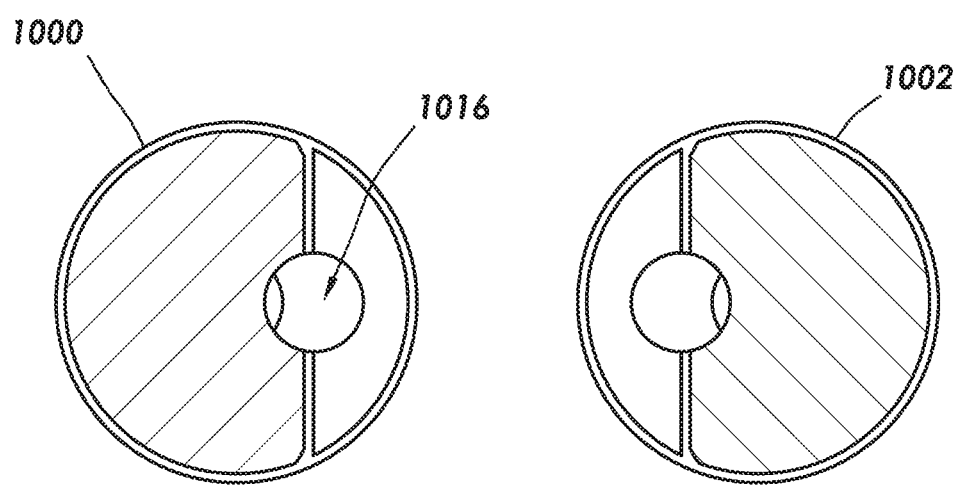
FIG. 10D shows a cross-sectional view of electrodes taken substantially along lines 10D-10D of FIG. 10C, and in accordance with at least some embodiments.

FIG. 10A shows a front elevation view of electrodes in accordance with at least some embodiments. FIG. 10B shows a cross-sectional view of the electrodes of FIG. 10A, in accordance with at least some embodiments. FIG. 10C shows a cross-sectional view of electrodes in which the spray direction forms an acute angle with the longitudinal central axis of the electrodes, and in accordance with at least some embodiments. FIG. 10D shows a cross-sectional view of electrodes taken substantially along lines 10D-10D of FIG. 10C, and in accordance with at least some embodiments.

Referring simultaneously to FIGS. 10A-10D, in other example embodiments, and referring to electrode 1000 as representative of both electrodes, electrode 1000 defines a single aperture or nozzle 1004 with a spray direction that is down towards the tissue at the target site. In particular, the electrode 1000 forms an angled surface 1006, and the nozzle 1004 is aligned with the angled surface 1006 such that fluid flow is directed along the angled surface 1006 towards the center of the electrode 1000 at the distal surface 1008 to help control the flow direction and ensure effective wetting of the distal surfaces. With respect to the horizontal surface 1010 (e.g., the horizontal surface 1010 forms a plane that is perpendicular to the a longitudinal central axis of the electrode 1000), the angled surface 1006 creates at an angle α in the range of between and including 90 to 120°, in some cases about 113°, and in other cases about 113°. The distal surface 1008 that contacts the tissue has reduced surface area to reduce drag and improve movement across the tissue, with an angle α, for example, of 113° providing a smaller contact surface area than an angle α of 90°. The example electrode 1000 of FIG. 10B defines a centrally located bore 1012, and an offset bore 1014 that creates the nozzle 1004. Thus, the centrally located bore 1012 and the offset bore 1014 are parallel to each other and the longitudinal central axis of the electrode 1000.

The example electrode 1000 of FIG. 10C defines the centrally located bore 1012 and an angled bore 1016 that creates the nozzle 1004. Thus, the centrally located bore 1012 and the angled bore 1016 form an angle between them. As shown in the embodiment of FIG. 10C, the spray direction defined by the bore 1014 is angled away from the angled surface 1006 and away from the longitudinal central axis of the example electrode 1000.

The spray directions defined by the nozzles of the embodiments of FIGS. 10A-10D may enhance the performance of the device by having the saline at the tip rather from the side of the device, reducing the risk of electrical bridging between the electrodes. This may result in a more efficient use of energy and hence improves the tissue lesions created by the device. The saline also takes a more direct path to the distal tip of the electrodes, which may efficiently deliver saline to the target tissue site, reducing charring of tissue, improving movement over tissue, and reducing the amount of saline used during the procedure. Furthermore less fluid at the target tissue site increase visibility of the device, which may enable the clinician to be confident in use of the device and ultimately provide a more accurate treatment.

The distance, D, of the proximal end of the saline outlets from the tip of the device is, for example, in the range of between and including 1.5 to 2.5 mm, in some cases about 1.75 mm, and in yet still other cases about 1.75 mm. This dimension is selected to ensure focused fluid delivery at the target tissue without being too close to the tissue such that the outlets would tend to get blocked.

The example angled surface 1006 encourages passive flow of fluid towards the tip of the electrode 1000. The horizontal surface 1010 may be oriented parallel to the direction of movement of the device, that is, in and out of the page in the view of FIG. 10A. The cut that forms the angled surface 1006 and horizontal surface 1010 results in reduced surface area in contact with the tissue (compared to the full rounded surface of the prior embodiments). The reduced surface area and parallel positioning of the ridges may enhance movement of the device across tissue. As a result the device may create a more uniform lesion when the device is used dynamically. The angled surface 1006 and horizontal surface 1010 may also increase control of movement ensuring that the clinician is able to effectively control the size and depth of the lesion created.

Figure 11A:
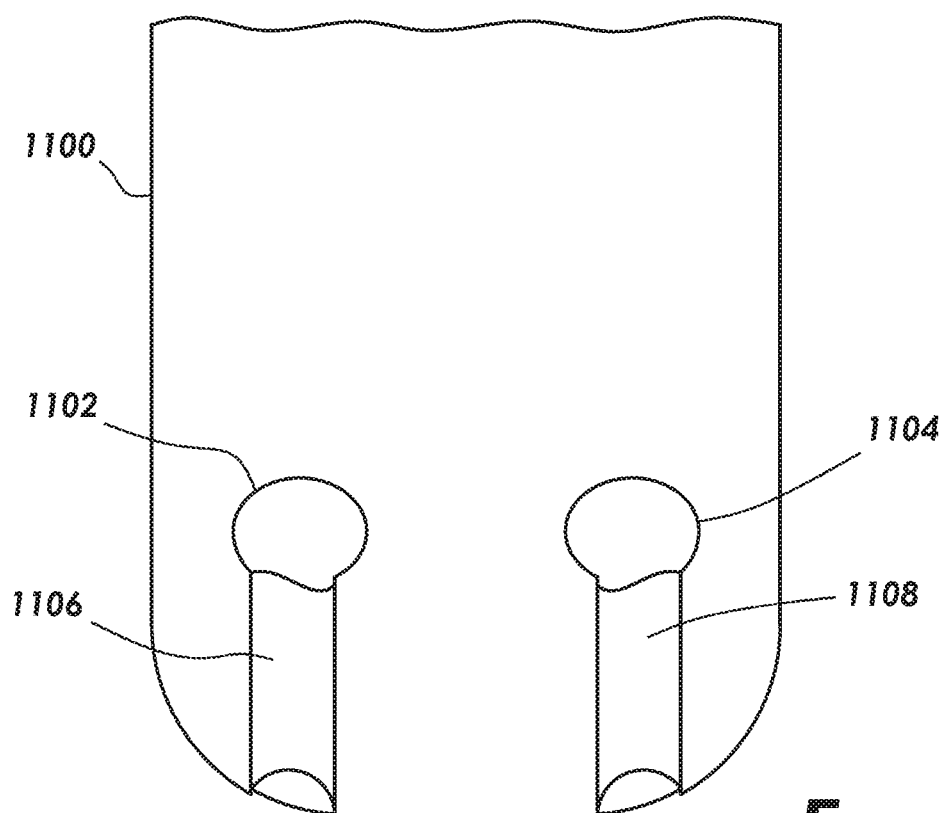
FIG. 11A shows a side elevation view of an electrode in accordance with at least some embodiments.

FIG. 11A shows a side elevation view of an electrode in accordance with at least some embodiments. In particular, FIG. 11A shows an electrode 1100 as seen from within an interstice between two electrodes. Many components and relationships of the electrode of FIGS. 9A (and 9B) are the same as discussed with respect to FIGS. 8A-8B, and will not be repeated again here so as not to unduly lengthen the specification. The example electrode 1100 defines two apertures or nozzles 1102 and 1104. Each nozzle 1102 and 1104 is associated with a trough or channel 1106 and 1108, respectively, that help direct the fluid flow toward the distal tip of the electrodes, improving wetting and fluid delivery to the tissue at the target site. Discussing channel 1106 as representative, channel 1106 intersects the nozzle 1102, and the channel 1106 progresses from the nozzle 1102 to the distal tip of the electrode 1100. The channel 1106 has a closed bottom and an open top, where the open top intersects an outer surface of the electrode 1100. Channel 1106 defines a channel direction that is parallel to the longitudinal central axis (not specifically shown) of the electrode 1100, but in other cases the channel direction need not be parallel the longitudinal central axis.

Figure 11B:
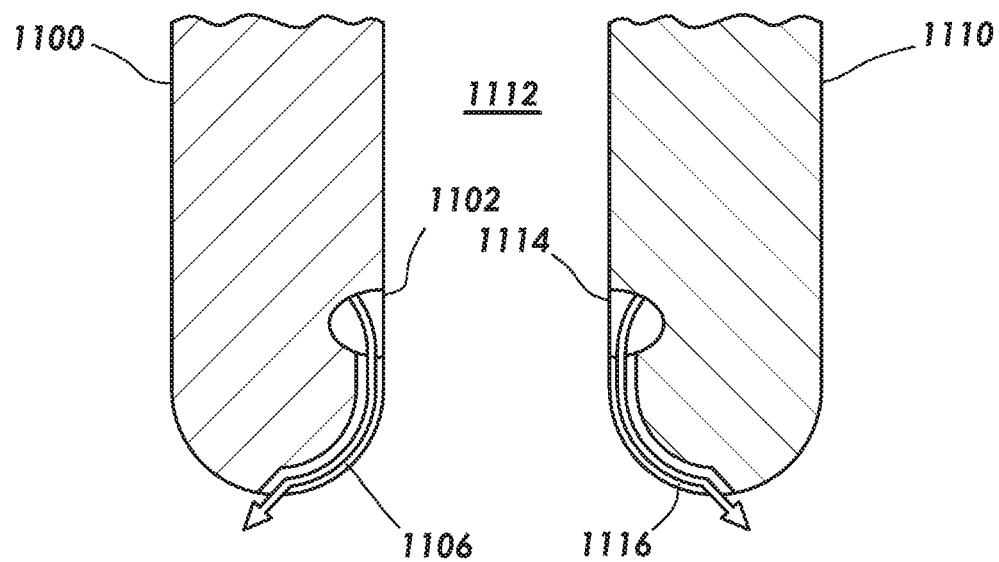
FIG. 11B shows a cross-sectional, front elevation, view electrodes in accordance with example embodiments.

FIG. 11B shows a cross-sectional, front elevation, view electrodes in accordance with example embodiments. In particular, the cross-sectional view of FIG. 11B is taken parallel to the plane of the page of FIG. 11A, and taken through one of the channels 1106 or 1108. Thus, visible in FIG. 11B is the electrode 1100, as well as a companion electrode 1110. As before, the electrodes 1100 and 1110 define an interstice 1112 between them. The nozzle 1102, as well as corresponding nozzle 1114 define spray directions into the interstice 1112, with angles between spray directions of nozzles of the same electrode taking any suitable angle as discussed above. In use, the saline not only sprays from the nozzle into the interstice 1112, but also a portion of the saline diverts and travels along the respective channels, such as channel 1106 associated with nozzle 1102, and channel 1116 associated with nozzle 1114. The flow of saline along the channels helps with wetting of the distal surfaces of the electrodes.

Figure 12:
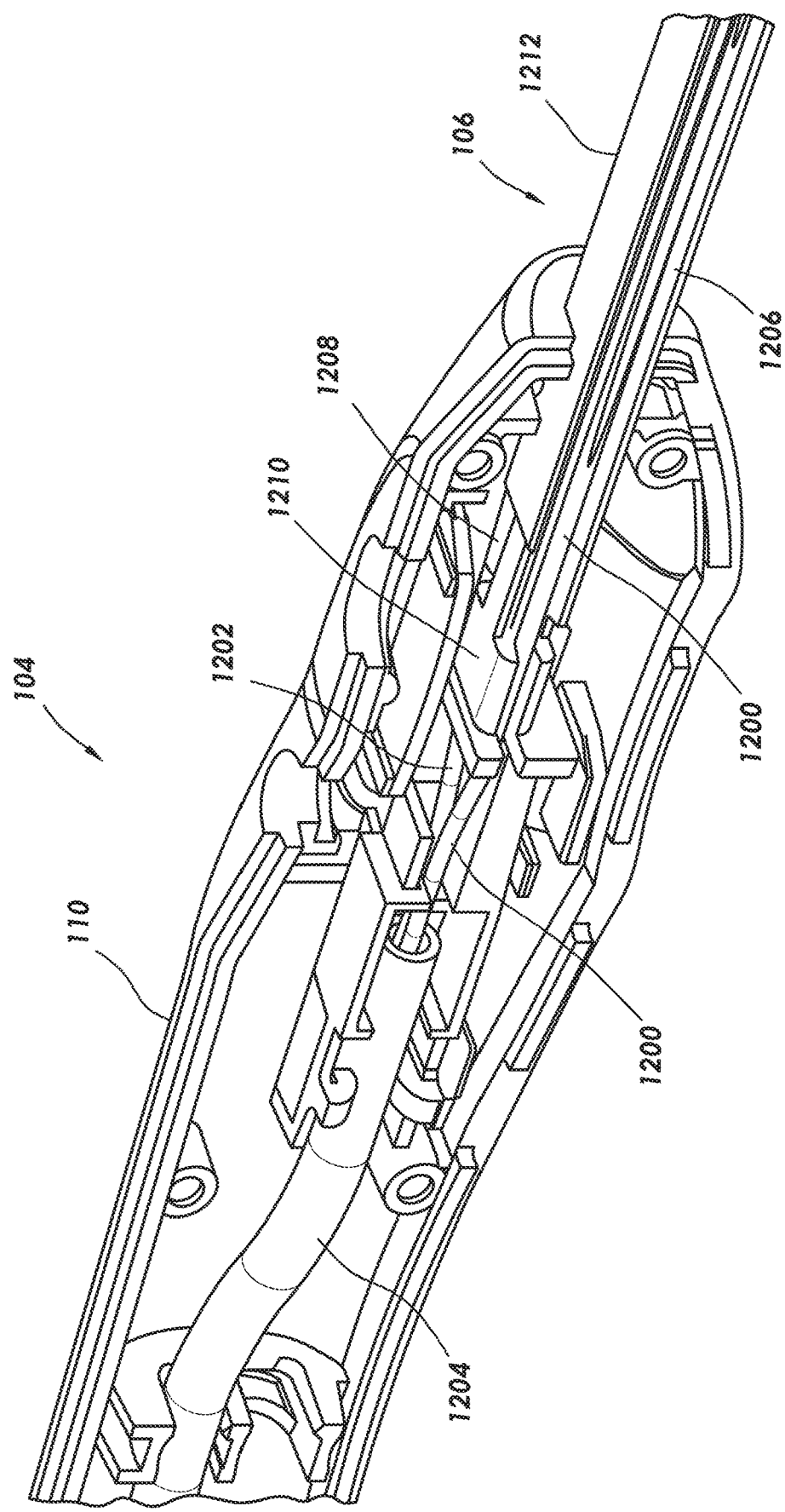
FIG. 12 shows a partial cross-sectional view of the device in accordance with at least some embodiments.

FIG. 12 shows a partial cross-sectional view of the device 104 in accordance with at least some embodiments. In particular, FIG. 12 shows a cross-sectional view of a portion of the handle 110 and elongate shaft 106 of the device 104 (FIG. 1). In example embodiments, each electrode (not visible in FIG. 12) has a dedicated fluid delivery tube 1200 and 1202 formed of an electrically insulative material, for example, nylon. Each electrode is supplied with saline by a respective fluid delivery tube 1200 or 1202 that extends along the length of the elongate shaft 106. Both fluid delivery tubes 1200 and 1202 fluidly couple to a single irrigation lumen 1204 within handle 110. Having the fluid delivery tubes 1200 and 1202 extend the length of the elongate shaft 106 to the handle 110 reduces the possibility of bridging of electrical current though the saline being delivered. However, depending the conductivity of the saline and other factors (e.g., applied voltage), bifurcating the irrigation lumen 1204 may take place at any suitable location, such as closer to the electrodes than the handle (e.g., within the elongate shaft 106), or at a proximal edge of electrodes. In cases where a single fluid delivery tube extends along the elongate shaft 106, the single fluid delivery tube may extend along an external surface of the elongate shaft 106, or between a shaft (or spine-like element) and a sheath.

Considering again embodiments in which the irrigation flow lumen 1204 is bifurcated within the handle 110, each fluid delivery tube 1200 and 1202 fluidly couples to a respective flow lumen within a respective electrode. In example cases, the electrical conductivity between the two electrodes along the saline within the fluid delivery tubes 1200 and 1202 is lower than the electrical conductivity directly between the two electrodes in contact with tissue. That is, to avoid electrical energy from travelling along the fluid delivery tubes, the shunt path length between the electrodes through the tubes 1200 and 1202 is made sufficiently long to have a lower conductivity (when filled with saline) than through the saline between the electrodes and/or through the tissue at the target site. The longer the fluid path through the two fluid delivery tubes, the longer the shunt path and the lower the electrical conductivity between the electrodes along the shunt path.

Still referring to FIG. 12, in example cases the energy delivery to the electrodes is through electrically conductive tubes. FIG. 12 shows two electrically conductive tubes, including electrically conductive tube 1204 shown in cross-section, and electrically conductive tube 1206 (only partially visible on its proximal end). Electrically conductive tubes 1206 and 1208 run parallel to each and form part of the elongate shaft 106. Each electrically conductive tube is coupled to a respective conductor in the flexible multi-conductor cable 142 (FIG. 1). The electrically conductive tubes 1206 and 1208 extend along the elongate shaft 106 from the handle 110 to the electrodes. Disposed within each electrically conductive tube 1206 and 1208 is a fluid delivery tube 1200 and 1202, respectively. In some cases, each fluid delivery tube is coaxial with its electrically conductive tube, but such is not required.

The example electrically conductive tubes are physically separated, parallel, and electrically insulated from each other by a non-conductive spine 1210 that extends from the handle 110 to the electrodes. The outer surface of the electrically conductive tubes may be electrically insulated with a coating or a sheath 1212 that covers the tubes and the spine 1210. The sheath 1212 may form a single smooth outer surface of elongate shaft 106. In an alternative embodiment, each electrically conductive tube is individually insulated using a coating or sheath.

Figure 13:
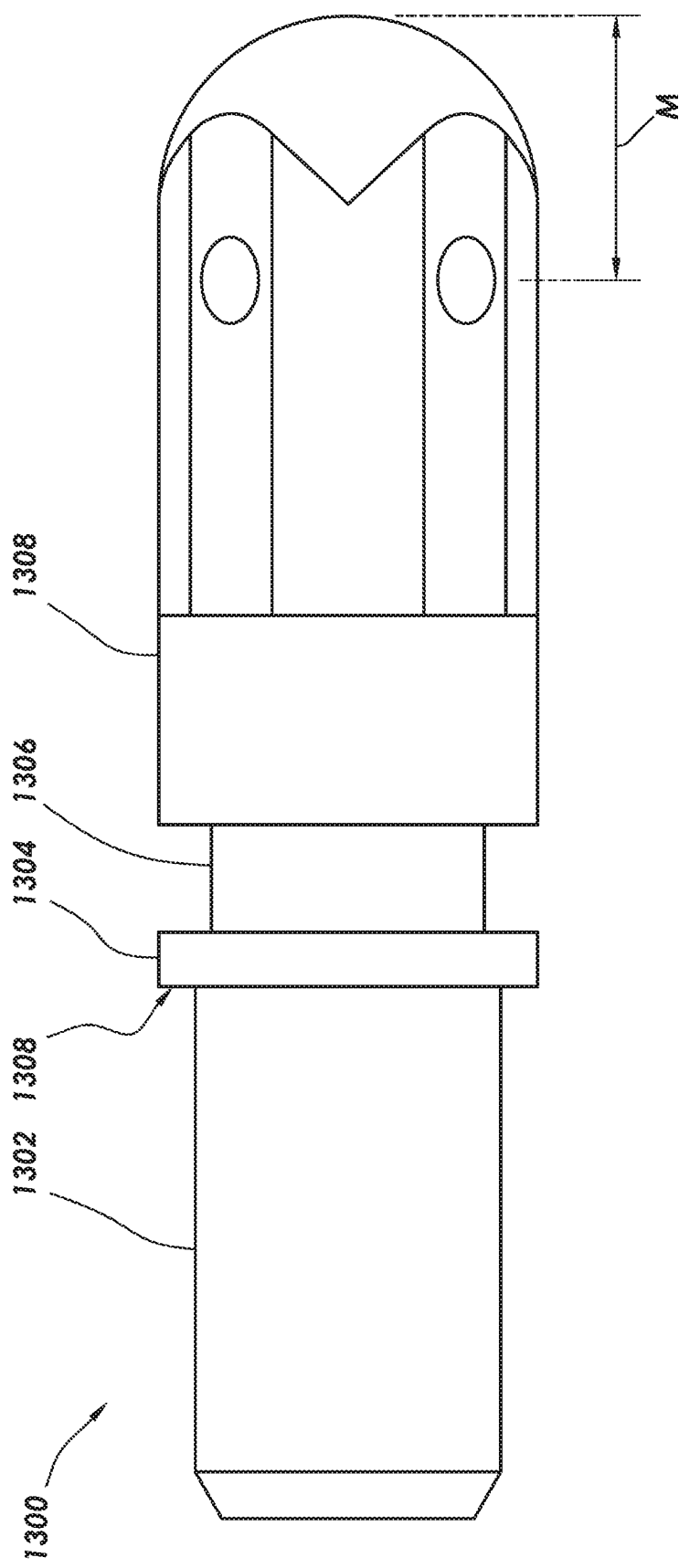
FIG. 13 show a side elevation view of an electrode in accordance with at least some embodiments.

FIG. 13 show a side elevation view of an electrode in accordance with at least some embodiments, and in order to discuss an example coupling between an electrode, the electrodes electrically conductive tube, and the spine. In particular, electrode 1300 is representative of any of the electrodes previously discussed. Working from left to right in the figure, the example electrode 1300 includes a proximal boss 1302, an annular ring 1304, an annular trough 1306, and an example exposed portion 1308. The boss 1302 has an outside diameter designed and constructed to telescope within an inside diameter of an electrically conductive tube (e.g., tube 1206 of FIG. 12), and to electrically couple to the tube. The boss 1302 is thus received within an electrically conductive tube, and the tube abuts the shoulder 1308 created between the boss 1302 and the annular ring 1304. As will be shown in greater detail below, the spine 1210 (e.g., FIG. 12) terminates in lugs, and each lug is coupled into a respective annular trough 1306 to hold the electrode 1300 in relationship to its respective electrically conductive tube.

Figure 14:
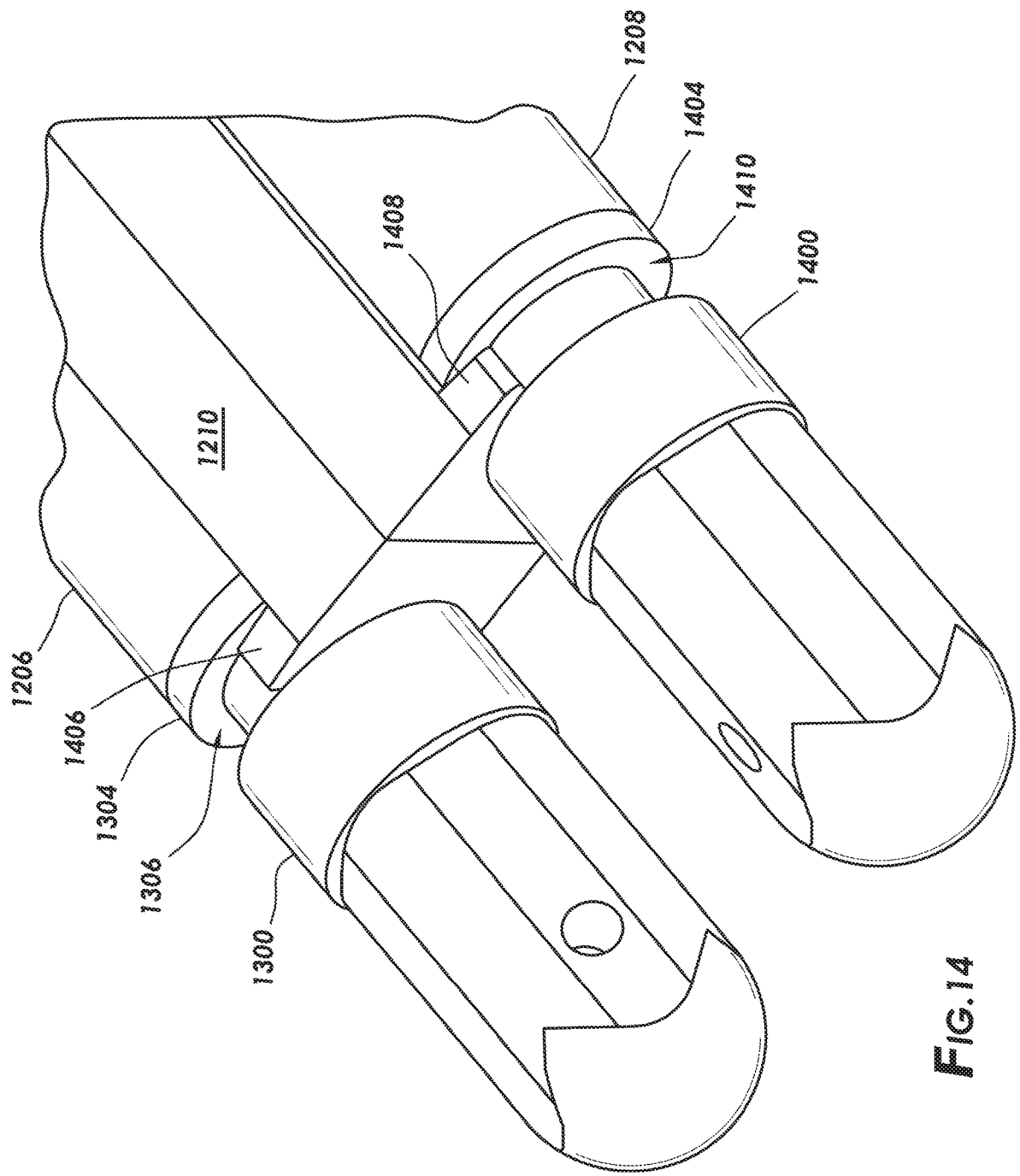
FIG. 14 shows a perspective view of a distal end of the device in accordance with at least some embodiments.

FIG. 14 shows a perspective view of a distal end of the device in accordance with at least some embodiments. In particular, visible in FIG. 14 is the example electrode 1300, along with a companion electrode 1400. Further visible is the example electrically conductive tube 1206, as well as an electrically conductive tube 1208 associated with electrode 1400. Between the electrically conductive tubes 1206 and 1208 resides the example spine 1210. In the arrangement of FIG. 14, the boss (not visible) of electrode 1300 is telescoped within the electrically conductive tube 1206, and the electrically conductive tube 1206 abuts the shoulder created by the annular ring 1304. Similarly, a boss (not visible) of electrode 1400 is telescoped within the electrically conductive tube 1208, and the electrically conductive tube 1208 abuts a shoulder created by the annular ring 1404. The example spine 1210 terminates in lugs 1406 and 1408. Lug 1406 is disposed within the annular trough 1306 of the electrode 1300. Similarly, lug 1408 is disposed within an annular trough 1410 of the electrode 1400. The lugs 1406 and 1408 aid in maintaining the spine 1210 in alignment with the electrically conductive tubes 1206 and 1208, as well as helps hold the electrodes 1300 and 1400 in operational relationship to the electrically conductive tubes 1206 and 1208, respectively.

As discussed with respect to FIG. 1, in some cases the saline is provided to the electrodes by way of a peristaltic pump 124 (FIG. 1). Peristaltic pumps are positive displacement pumps that provide volume-controlled flow. However, peristaltic pumps deliver the flow in pulses caused by the interaction of the rotating head against the stationary components, the pulses referred to as fluid flow pulsatility. Coagulation is made more uniform by decreasing the fluid flow pulsatility from the peristaltic pump. The specification now turns to example systems to reduce the fluid flow pusatility.

Figure 15:
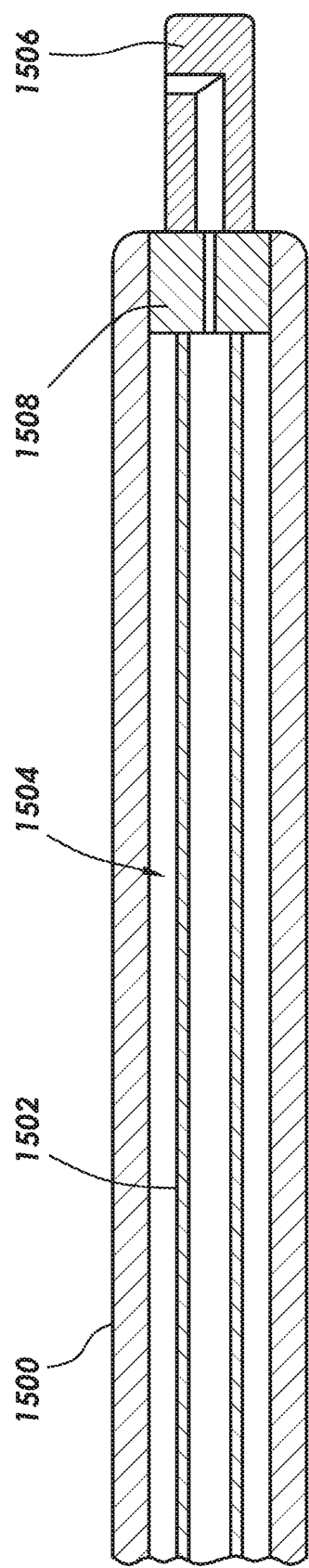
FIG. 15 shows a simplified cross-sectional view of an electrically conductive tube, a fluid delivery tube, and an electrode, in accordance with at least some embodiments.

FIG. 15 shows a simplified cross-sectional view of an electrically conductive tube, a fluid delivery tube, and an electrode, in accordance with at least some embodiments. In particular, the arrangement of FIG. 15 is designed and constructed to reduce fluid flow pulsatility by use of a flow restrictor and compliant tubing. FIG. 15 shows an example electrically conductive tube 1500, which electrically conductive tube 1500 is representative of any of the previously discussed electrically conductive tubes. Disposed within the electrically conductive tube 1500 is a fluid delivery tube 1502, which fluid delivery tube 1502 is representative of an any of the previously discussed fluid delivery tubes. In accordance with these embodiments, the fluid delivery tube 1502 has an outside diameter that is smaller than an inside diameter of the electrically conductive tube 1500, thus forming an annular volume 1504 between the outside diameter of the fluid delivery tube 1502 and the inside diameter of the electrically conductive tube 1500. In FIG. 15, the fluid delivery tube 1502 is shown to be coaxial with the longitudinal central axis of the electrically conductive tube 1500; however, in some cases the fluid delivery tube may rest against the inside diameter under the force of gravity, particularly under the weight of saline flowing within the inside diameter of the fluid delivery tube 1502.

Disposed on the distal end of the electrically conductive tube 1500 is an electrode 1506, which electrode 1506 is representative of any of the previously discussed electrodes. Disposed fluidly between the fluid delivery tube 1502 and the flow lumen within the electrode 1506 is a flow restrictor 1508. The flow restrictor 1508 may take any suitable form, such as an orifice or tortious path device. In some cases, the flow restrictor 1508 is a separate element disposed physically between the fluid delivery tube 1502 and the flow lumen of the electrode 1506. In yet still other cases, the flow restrictor 1508 may be implemented in another component, such as the boss (e.g., boss 1302 of FIG. 13) of the electrode. Placing the flow restrictor 1508 in the path of the saline increases resistance to flow and increases back pressure. The fluid delivery tube 1502 upstream of the flow restrictor 1508 is made of compliant tubing. The compliance of the fluid delivery tube 1502 acts to damp the pulses generated by an upstream peristaltic pump. That is, the outside diameter of the fluid delivery tube 1502 expands and contracts within the annular volume 1504 to provide the pressure damping aspects.

In yet still other cases, the flow restrictor 1508 may be implemented by a portion of the fluid delivery tube 1502 itself. For example, a portion of the fluid delivery tube 1502 may be implemented in the form of a rigid or non-compliant tube with reduced inside diameter. The rigid or non-compliant portion may be disposed fluidly before or upstream of the electrode 1506. In these cases, the compliance of upstream portions of the fluid delivery tube 1502, and/or the compliance of the flexible tubular member 122 (FIG. 1), may provide the fluid pressure damping aspects.

Figure 16:
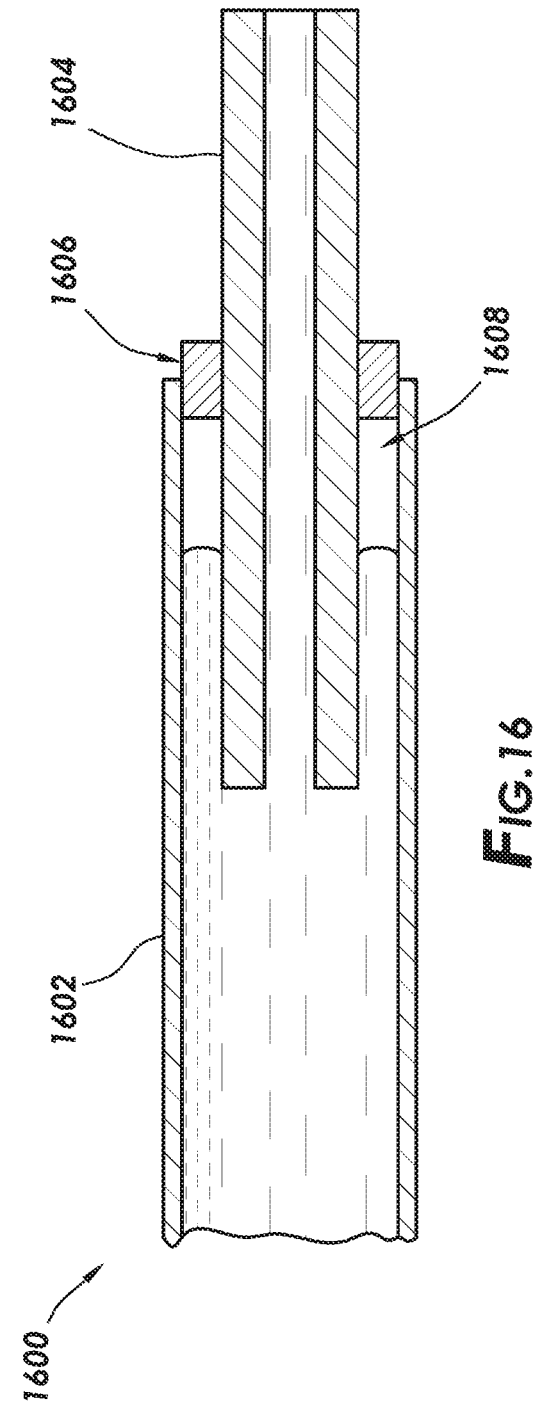
FIG. 16 shows a simplified cross-sectional view of a portion of a fluid delivery tube in accordance with at least some embodiments.

FIG. 16 shows a simplified cross-sectional view of a portion of a fluid delivery tube in accordance with at least some embodiments. In particular, FIG. 16 shows a fluid delivery tube 1600, which fluid delivery tube 1600 is representative of any of the previously discussed fluid delivery tubes. The fluid delivery tube 1600 comprises a first tube portion 1602 fluidly coupled to a second tube portion 1604. In the example system, the first tube portion 1602 has an inside diameter, and the second tube portion 1604 has an inside diameter smaller than the inside diameter of the first tube portion 1600, thus forming a flow restrictor. As shown, the second tube portion 1604 has an outside diameter smaller than the inside diameter of the first tube portion 1602. The first tube portion 1602 is telescoped over the second tube portion 1604, and held in place by way of an annular stopper 1606. The annular stopper 1606 forces the second tube portion 1604 to be coaxial with the first tube portion 1602, thus forming an annular volume 1608 between the inside diameter of the first tube portion 1602 and the outside diameter of the second tube portion 1604.

When saline is pumped into the fluid delivery tube 1600, the saline traps air within the annular volume 1608. The trapped air creates an air pillow in the annular volume 1608. The air pillow compresses with pulses and thus acts to provide the pressure damping aspects.

Various embodiments may also include an option to aspirate fluid from the treatment site in addition to fluid delivery. Aspirated fluid may include saline, blood, and/or smoke generated during coagulation. Removing blood may aid in discovering the source of bleeding. Removing smoke may aid in visualization of the target site. Removing saline may help reduce excess saline pooling around electrodes, which may potentially waste energy and reduce the energy going into the tissue to coagulate the tissue.

Figure 17:
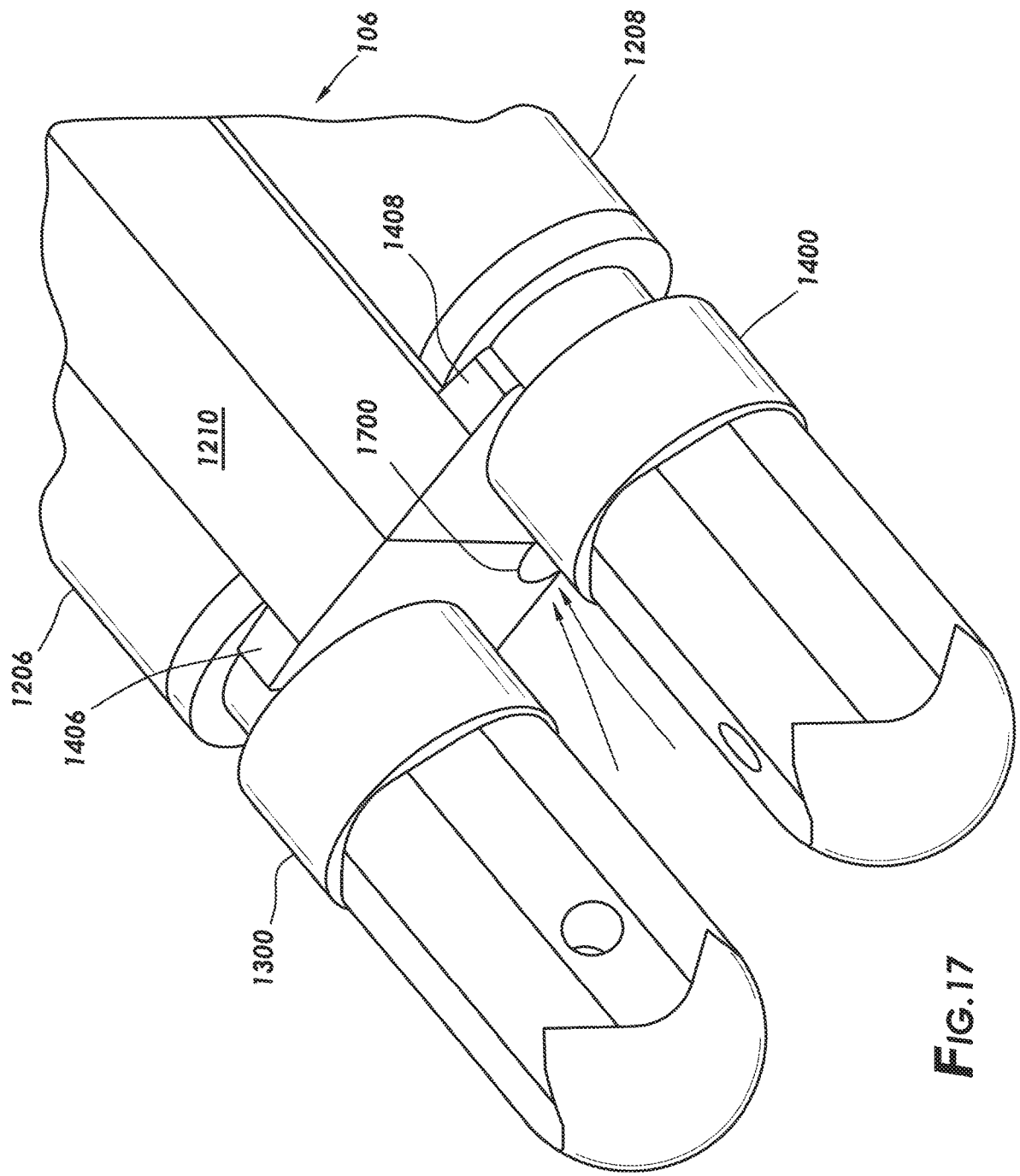
FIG. 17 shows a perspective view of distal end of a device in accordance with at least some embodiments.

FIG. 17 shows a perspective view of distal end of a device in accordance with at least some embodiments. In particular, FIG. 17 shows the example electrodes 1300 and 1400, the electrically conductive tubes 1206 and 1208, the spine 1210, and the lugs 1406 and 1408 disposed within their respective annular grooves. FIG. 17 also shows the example device can define an aspiration aperture 1700 disposed between the two electrodes 1300 and 1400. The aspiration aperture 1700 may be on or biased towards a side of the distal end of the device facing the tissue at the target site such that the aspiration aperture 1700 is closer to the tissue, so as to better aspirate the blood and saline. Alternatively, placing the aspiration aperture 1700, or an additional aspiration aperture, on the opposite side, away from the tissue at the target site, would primarily remove smoke.

The aspiration aperture 1700 may have a single inlet port or a plurality of inlet ports fluidly coupled together. Employing a plurality of inlets may be beneficial to maintain aspiration flow should one of the inlet ports become clogged. Potential clogging is not likely to be caused by tissue debris as coagulation does not tend to form debris; however, coagulated blood may clog an inlet.

The example aspiration aperture 1700 may be fluidly coupled to a fluid transport apparatus that includes a tube or conduit that extends along the elongate shaft 106 and may be fluidly coupled to a vacuum source. In one example embodiment, the aspiration conduit may be defined within the spine 1210. Control or syphoning of the vacuum pressure may be implemented to limit the force of the vacuum. While the aspiration may remove some saline from the target site and electrode area, not all of the saline from the electrode area should be removed as a dry electrode surface would reduce the coagulation performance, and trigger a need to re-wet the electrodes before applying energy. In addition, aspiration may be controlled to reduce drawing the saline delivered directly from the nozzles into the aspiration aperture, should aspiration and delivery be operated concomitantly. This may increase likelihood of electrical bridging between the electrodes and again, cause inadequate coating of the electrodes with the saline, affecting coagulation. Preferably the aspiration aperture should be 5-8 mm proximally spaced from the electrode tip and 3-5 mm away from the delivery apertures.

In another case, an aspiration aperture may be disposed adjacent to or through an outer, lateral portion of each electrode. Removing fluid from the outer portions of the electrodes may help keep the tissue effect directly between the electrodes, and reduce thermal spread laterally or radially away from the interstice between the two electrodes.

In example cases, aspiration can be selectively controlled. That is, while delivery of saline may be in operative communication with the coagulation controller 116 (FIG. 1) so that saline is delivered concomitantly with energy delivery, aspiration may more selectively controlled as a clinician's choice. Advantageously, the selective control of aspiration may replace the need for a separate suction tool used during surgery and reduce the cost of the procedure. Selective aspiration control may be through a moveable valve or the speed of a pump, for example, an additional peristaltic pump. The control may be in communication with a button on the handle (not shown) or a foot switch.

Figure 18:
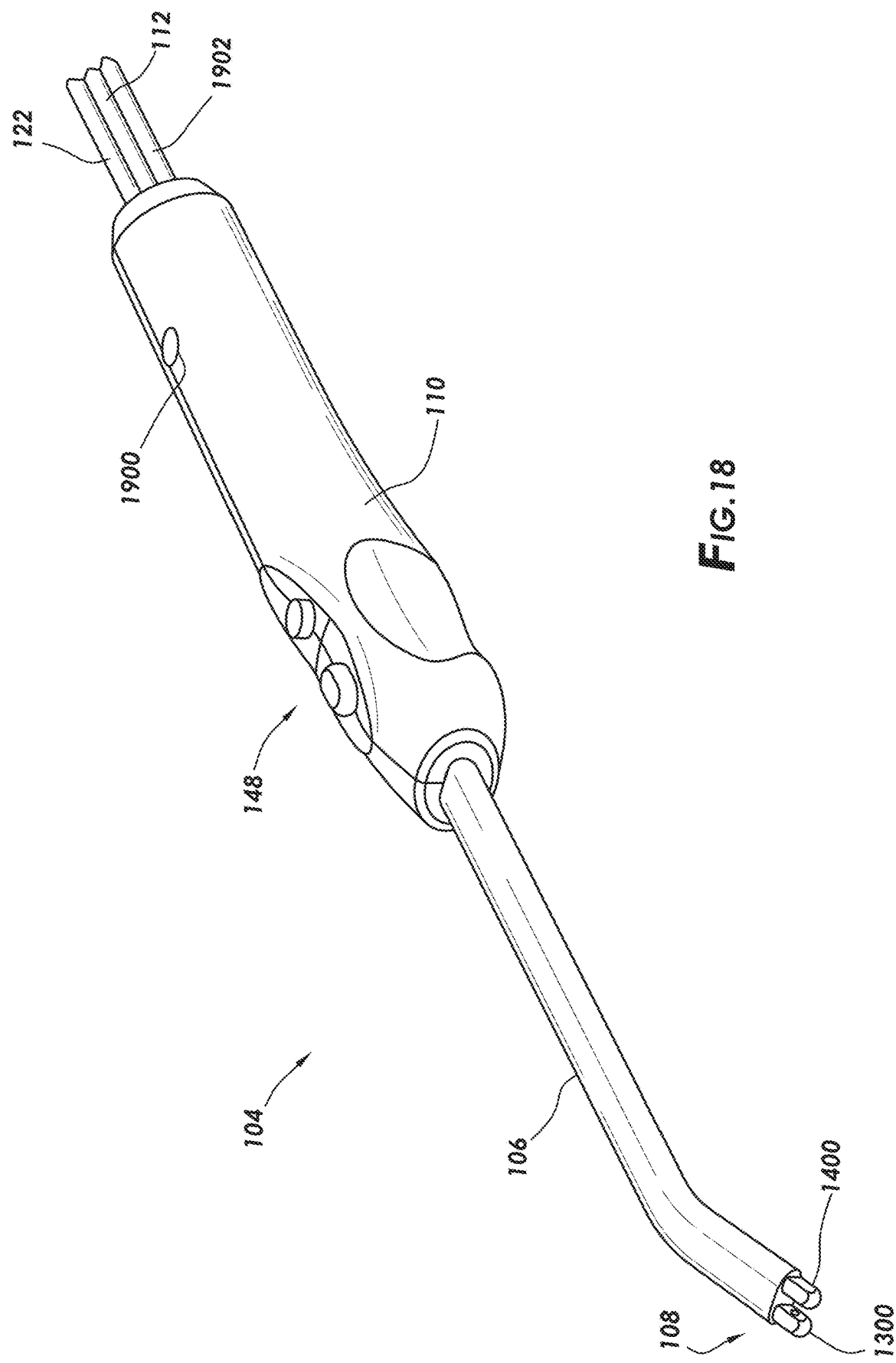
FIG. 18 shows a perspective view of a device in accordance with at least some embodiments.

FIG. 18 shows a perspective view of a device in accordance with at least some embodiments. In particular, FIG. 18 shows a device 104 comprising the electrodes 1300 and 1400, the elongate shaft 106, the handle 110, the buttons 148, the flexible multi-conductor cable 112, and the flexible tubular member 122. Also shown in FIG. 18 is an example suction portion 1900. The example suction port 1900 is fluidly coupled to a suction lumen 1902. Both the suction port 1900 and suction lumen 1902 are fluidly coupled to an aspiration transport conduit (not visible) which runs along the length of the elongate shaft 106 and within the handle 110. The suction lumen 1902 may be fluidly coupled to a source of vacuum, such as peristaltic pump or wall suction provided in a hospital room. The clinician selectively controls the aspiration by moving a finger to cover and uncover the suction port 1900. In operation, when the suction port 1900 is not covered, there is no or reduced aspiration through the aspiration inlet at the distal end 108 of the device 104. The selective control, as opposed to constant aspiration, reduces the potential to clog the suction lumen by limiting suction to times that are chosen by the clinician. The suction port 1900 may be selectively covered while delivering energy to control and adjust the desired tissue effect. The specification now turns to considerations regarding control of the speed or aggressiveness of coagulation.

The speed or aggressiveness of coagulation may be controlled, at least in part, based on the energy delivered to the electrodes. In some cases, the clinician chooses an applied voltage setting as a coagulation energy setting. In an example range of applied voltage settings between and including 110 Volts (V) and 200V, the 110V setting may be a lower coagulation energy setting and the 200V setting a higher coagulation energy setting. Changing the applied voltage setting alters the RF voltage applied to the electrodes from between about 120V RMS to about 165V RMS. The higher the applied voltage setting, the higher the applied voltage, and the more tissue around the electrodes that is affected, both deeper and wider, for example, by quicker desiccation and more volume of tissue being treated.

Relatedly, consider again activation of the button 150 (FIG. 1). Activation of the button 150 may supply energy to the tissue according to the clinician-selected applied voltage setting. The MAX button 152, when activated, provides an energy output at a higher level than the applied voltage setting to increase coagulation. The MAX button 152 may automatically communicate with the controller to supply the RF output voltage to the electrodes at a higher voltage level, such as the upper end of the applied voltage range (e.g., 165V). Alternatively, upon activation of the MAX button 152 the applied voltage may be increased by a percentage of the applied voltage setting, by a fixed value, or by a fixed number of settings higher than the selected value. For example, if the applied voltage setting is 120V, activation of the button 152 may communicate with the controller to supply a voltage 30V higher or 30% higher.

In addition giving the clinician the ability to select from a range of applied voltage settings (and thus a range of applied energy), in accordance with example embodiments the clinician may also choose from a plurality of flow rate settings for the saline. In example embodiments, the clinician may select from three or more flow rate settings, and in some cases five flow rate settings. Each flow rate setting determines the flow of saline during use at each applied voltage setting. Higher applied voltages may vaporize some of the fluid being delivered, and thus at higher applied voltage settings an increased flow rate may be implemented to balance the vaporization and maintain the more consistent fluid coating around the electrodes. To ensure a suitable range of flow is provided, the coagulation controller 116 may automatically adjust flow rate as function of applied voltage setting.

Figure 19:
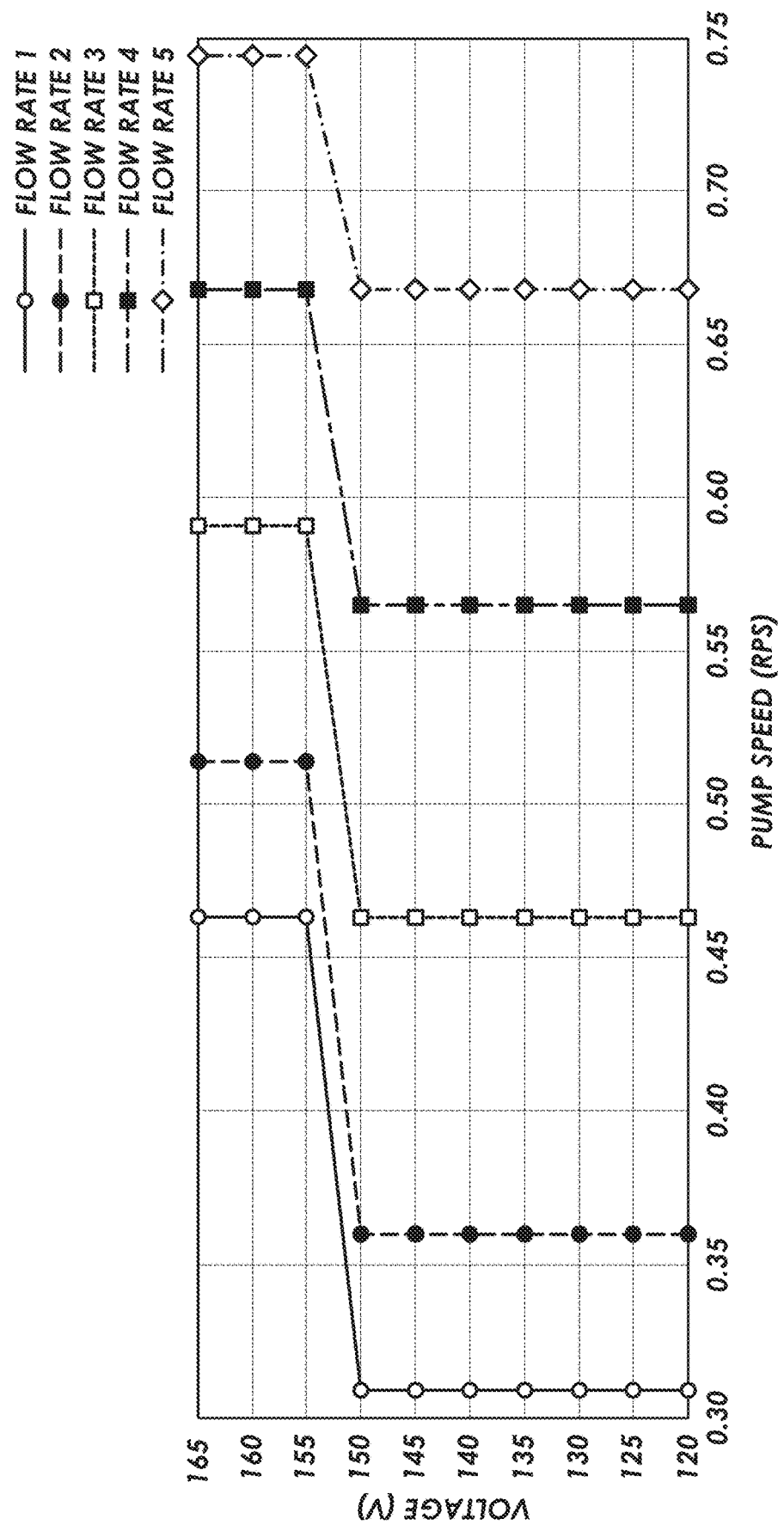
FIG. 19 shows a graph of applied voltage against pump speed, in accordance with at least some embodiments.

FIG. 19 shows a graph of applied voltage against pump speed, in accordance with at least some embodiments. In particular, the vertical axis shows applied voltage in Volts RMS, from 120V on the low end to 165V on the high end in 5V increments. The range of applied voltage from 120V to 165V in 5V increments may be correlated to the applied voltage setting range of 110V to 200V in 10V increments. In other cases, however, the numerical value of the applied voltage setting may be directly correlated to the applied voltage. The horizontal axis shows pump speed of a peristaltic pump in revolutions per second (RPS). Inasmuch as pump speed of a peristaltic pump is directly related to the flow rate, the horizontal axis may be equivalently considered to represent flow rate. In the example graph, five distinct flow rates are show, representing five distinct flow rate settings. Thus, the graph illustrates a system in which the clinician may choose from one of ten applied voltage settings, and one of five flow rate settings, with which to perform coagulation.

In the example illustrated by FIG. 19, the selected flow rate setting results in a single flow rate for a range of applied voltages, but less than all the applied voltages. Consider, as an example, Flow Rate 2. The example Flow Rate 2 provides a peristaltic pump speed of just over 0.35 RPS for all the applied voltages of 120V through 150V, inclusive. However, at a threshold applied voltage (in the example 155V) the pump speed and thus the flow rate increases to ensure proper wetting of the electrodes. Contrary to what the graph of FIG. 19 may imply, example systems do not implement mathematically linear flow control between any two applied voltages. Rather, the clinician may select applied voltage in 5V increments (by choosing an applied voltage setting in 10V increments), and it follows there is a step change in flow rate of saline at the threshold voltage. Considering the example Flow Rate 2, at an applied voltage of 150V the pump speed is just over 0.35 RPS, and at an applied voltage 155V the pump speed is just over 0.45 RPS. In the example system, the clinician cannot select an applied voltage setting that results in an applied voltage between 150V and 155V, and thus there is no intermediate pump speed setting between 150V and 155V. In other cases, however, with increased number of applied voltages (and applied voltage settings), linear interpolation for pump speed is possible.

In accordance with example embodiments, applied voltage is controlled in an open loop sense. That is, the clinician chooses an applied voltage setting, and that applied voltage setting results in applied voltage at an expected impedance between the electrodes. However, changes in the actual impedance between the electrodes affects the applied voltage. For example, applying energy to the electrodes when the electrodes are held in the air (e.g., higher impedance) may result in higher applied voltage to the electrodes. Oppositely, applying energy to the electrodes when the saline is electrically bridging, and thus shunting or shorting (e.g., lower impedance) the electrodes may result in lower applied voltage. The coagulation controller 116 in some embodiments does not attempt to compensate for changes in impedance; rather, based on the applied voltage setting the coagulation controller operates in a way that produces the applied voltage at the expected impedance, but does not change operation as the actual impedance varies around the expected impedance.

Similarly, in example embodiments the peristaltic pump speed is controlled in an open loop sense. That is, the clinician chooses a pump speed setting, and that pump speed setting results in a pump speed (and thus flow rate). Changes in the applied voltage (e.g., caused by fluctuation in impedance) do not change the pump speed. That is, the coagulation controller 116 in some embodiments does not attempt to compensate the pump speed for changes actual applied voltage caused by fluctuations in impedance. However, when applied voltage increases intentionally, such as by activation of MAX button 152, the pump speed may correspondingly increase. In example embodiments the coagulation controller 116 implements the flow control as a function of applied voltage as shown in FIG. 19 by use of a look-up table. The coagulation controller 116 receives the applied voltage or applied voltage setting, and receives the Flow Rate setting, and performs a look up in a lookup table to select the pump speed accordingly.

Figure 20:
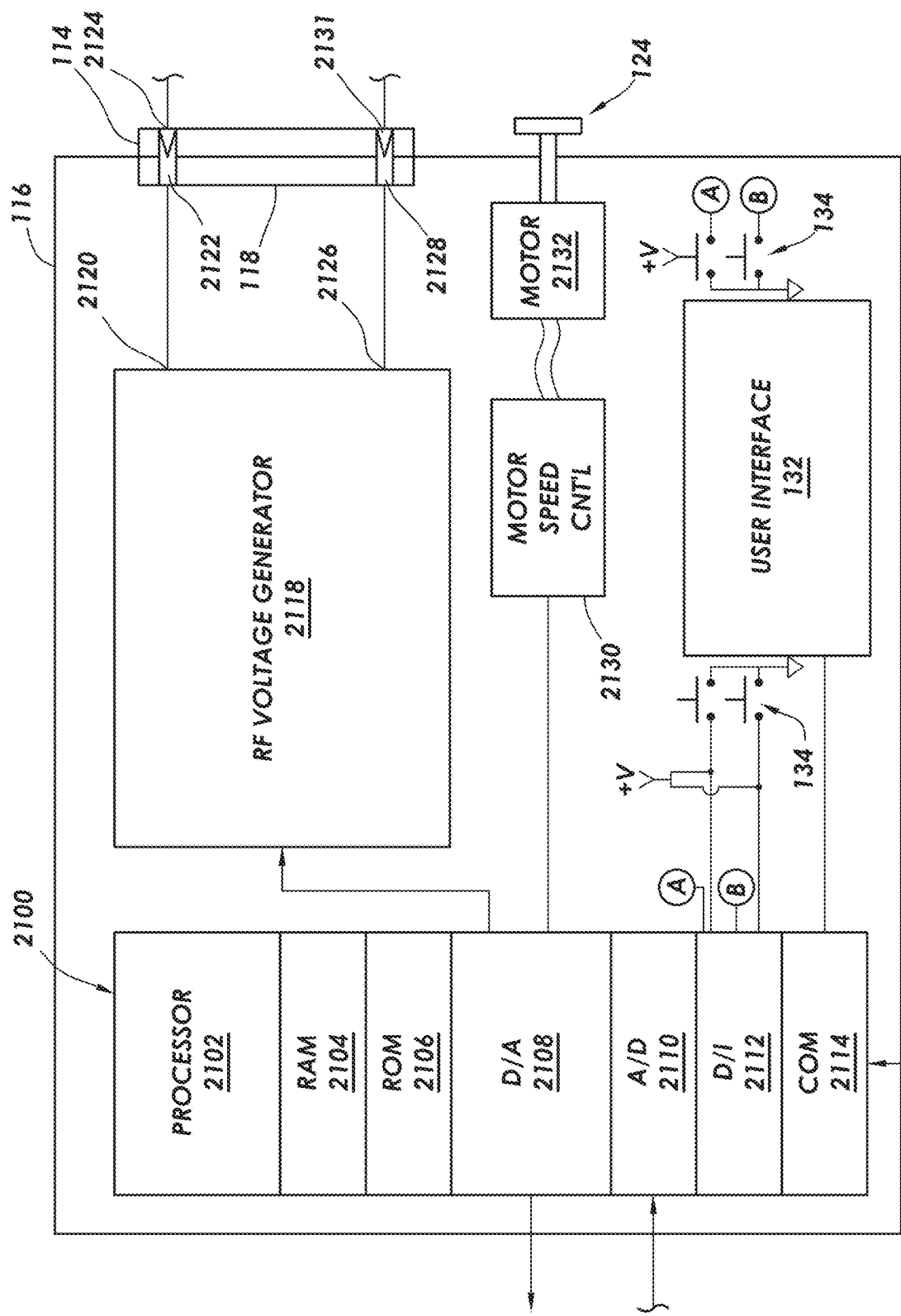
FIG. 20 shows, in block diagram form, an example coagulation controller in accordance with at least some embodiments.

FIG. 20 shows, in block diagram form, an example coagulation controller 116 in accordance with at least some embodiments. In particular, the example coagulation controller 116 has a control system 2100 coupled to various internal and external components. In the example system of FIG. 20, the control system 2100 takes the form of a microcontroller having processor 2102 electrically coupled to random access memory (RAM) 2104, read-only memory (ROM) 2106, digital-to-analog (D/A) outputs 2108, analog-to-digital (A/D) inputs 2110, digital inputs (D/I) 2112, as well as communication logic (COM) 2114 sections. Though control system 2100 is shown in the form of a microcontroller, in other cases individual components (i.e., an individual processor, RAM, ROM, etc.) may be combined to implement the functionality, or other devices such as field-programmable gate arrays (FGPAs), application-specific integrated circuits (ASICs), programmable logic controllers (PLCs), programmable logic devices (PLDs), and discrete components may be used in place of or in addition to the noted components. The example RAM 2104 may be the working memory for the processor 2102. ROM 2106 may store programs and data in a non-volatile fashion, and the processor 2102 may copy the programs and data from the ROM 2106 to RAM 2104 during execution of the programs. In some cases, the ROM 2106 is the long term storage location for the lookup table that relates applied voltage to flow rate setting to control peristaltic pump speed, and thus the lookup table too may be copied to RAM 2104 in operation. The digital-to-analog outputs 2108 may be used to provide analog signals to other devices within the coagulation controller 116, such as the pump motor speed controller 2116 (discussed more below) and the RF voltage generator 2118. The analog-to-digital inputs 2110 may provide the control system 2100 the ability to read analog signals. The digital inputs 2112 may be used to receive information into the control system 2100, such as information from the foot pedal devices 138/140, buttons 134 of the coagulation controller 116, or buttons 148 on the device 104. Finally, the communication logic 2114 may be used for packet-based communications with internal or external devices (e.g., interface device 132, or as an alternate means to communicate with the pump motor speed controller 2116).

The RF voltage generator 2118 defines a first connection or first lead 2120 which couples to a first terminal 2122 (e.g., electrical pin) in the controller connector 118. In use, an electrical pin 2124 in the wand connector 114 couples the first terminal 2122 to a first electrode on the distal end of the device 104 (FIG. 1). Likewise, the RF voltage generator 2118 defines a second connection or second lead 2126 which couples to a second terminal 2128 (e.g., electrical pin) in the controller connector 118. In use, an electrical pin 2131 in the wand connector 114 couples the other electrode on the distal end of the device 104.

The RF voltage generator 2118 is configured to produce coagulation energy at a coagulation frequency. In accordance with example embodiments the coagulation frequency produced by the RF voltage generator 2118 may be between about 5 kHz and 20 MHz, in some cases being between about 30 kHz and 2.5 MHz, in other cases being between about 50 kHz and 500 kHz, and in a particular case about 100 kHz. As discussed above, the coagulation voltage may be between and including 120V and 165V RMS. In the example system shown the RF voltage generated 2118 receives commands by way the digital-to-analog outputs 2108; however, the RF voltage generator 2118 may be provided commands in any suitable form, such as digitally (e.g., by way of digital outputs, no specifically shown) or by way of packet-based messages (e.g., by way of the communication logic 2114).

The coagulation controller 116, and specifically the control system 2100, may implement control of coagulation, including control of applied voltage and peristaltic pump speed. With respect pump speed, the example coagulation controller 116 implements a motor speed controller 2130 coupled to a motor 2132, where the peristaltic pump 124 is turned by the motor 2132. The motor 2132 may take any suitable form. For example, the motor 2132 may be a DC electric motor, and thus the motor speed controller 2130 provides a DC voltage to the electric motor which controls the speed of the output shaft. In other cases, the motor 2132 may be an AC electric motor, and thus the motor speed controller 2130 provides an AC voltage at varying voltage and frequency which controls the speed of the output shaft. In yet still other cases, the motor 2132 may be a pneumatic motor, and thus the motor speed controller 2130 provides air at varying pressures, where the pressure controls the speed of the output shaft. Thus, regardless of the type of motor 2132 implemented, the motor speed controller 2130 controls the speed of the motor responsive to commands provided from the control system 2100. While in the example system the command to the motor speed controller 2130 is shown to be an analog signal, in other cases the motor speed controller 2130 may receive commands in any suitable form, such as digitally (e.g., by way of digital outputs, no specifically shown) or in packet-based messages (e.g., through the communication logic 2114). Finally, while the motor 2132 is shown to directly couple to the peristaltic pump 124, in other cases various gears and/or belts may be used to transfer the rotational motion of the shaft of the motor 2132 to peristaltic pump 124. While FIG. 20 is based on having a rotary peristaltic pump, one having ordinary skill, and with the benefit of this disclosure, could modify the system to be used with other types of outflow pumps, such as linear peristaltic pumps or centrifugal pumps combined with flow measurement devices (as the flow rate through a centrifugal pumps is not as directly related to speed as is a positive displacement pump (such as a peristaltic pump)).

It is noted that the embodiments of FIG. 20 show the peristaltic pump 124 as an internal or integral device with the coagulation controller 116 (e.g., within the same enclosure); however, in other cases the peristaltic pump 124 may be an external component to the coagulation controller 116. Moreover, while only one connected set of pump motor speed controller, motor, and peristaltic pump is shown in FIG. 20, a coagulation controller may implement two or more (e.g., a second pump to control aspiration).

Thus, in example embodiments the control system 2100 comprises RAM 2104 and ROM 2106 (and possibly other non-transitory storage mediums) that store instructions that implement the coagulation control strategies discussed above. Example instructions, when executed by the processor, may cause the coagulation controller to: apply RF energy between a first electrode and a second electrode; and simultaneously flow saline through the electrodes of the device 104. Other example instructions, when executed by the processor 2102, may cause the coagulation controller to: accept an indication of a flow rate setting from a plurality of flow rate settings; accept an indication of an applied voltage setting; provide energy to the electrodes in a range of voltages determined by the applied voltage setting, the energy provided changes over time as a function of impedance experienced between the first and second electrodes; and simultaneously pump the electrically conductive with the flow rate selected by the coagulation controller from a table that relates the applied voltage setting and the flow rate setting, and the flow rate remains constant as energy provided changes over time.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of operating an electrosurgical coagulation device, the method comprising:
    applying radio frequency (RF) energy between a first electrode and a second electrode, the first electrode defines a first longitudinal axis, the second electrode defines a second longitudinal axis coplanar with the first longitudinal axis, and the first and second electrodes define an interstice; and simultaneously
    flowing an electrically conductive fluid through only a first nozzle and a second nozzle of the first electrode, the first nozzle defines a first spray direction, the second nozzle defines a second spray direction, and a first angle between the first spray direction and the second spray direction is 180 angular degrees (°) measured through the interstice; and simultaneously
    flowing an electrically conductive fluid through only a third nozzle and a fourth nozzle of the second electrode, the third nozzle defines a third spray direction, the fourth nozzle defines a fourth spray direction, and a second angle between the third spray direction and the fourth spray direction is 180° measured through the interstice, wherein
    the first nozzle and the second nozzle are coaxial along a third longitudinal axis that (i) does not intersect the first longitudinal axis and (ii) is located on an interstitial side of the first longitudinal axis such that the third longitudinal axis of the first nozzle and the second nozzle is offset from the first longitudinal axis toward the interstice, and
    the third nozzle and the fourth nozzle are coaxial along a fourth longitudinal axis that (i) does not intersect the second longitudinal axis and (ii) is located on an interstitial side of the second longitudinal axis such that the fourth longitudinal axis of the third nozzle and the fourth nozzle is offset from the second longitudinal axis toward the interstice.

2. The method of claim 1 further comprising an orientation of the first and second nozzles are mirror images across the interstice of locations of the third and fourth nozzles, respectively.

3. The method of claim 1 wherein the first, second, third, and fourth spray directions reside in a common plane.

4. The method of claim 1:
    wherein flowing the electrically conductive fluid through the first nozzle and the second nozzle further comprises flowing with the first and second spray directions forming a first acute angle with respect to the first longitudinal axis, the first acute angle opens toward a target tissue;
    wherein flowing the electrically conductive fluid through the third nozzle and the fourth nozzle further comprises flowing with the third and fourth spray directions forming a second acute angle with respect to the second longitudinal axis, the second acute angle opens toward the target tissue.

5. The method of claim 1 further comprising:
    contacting a target tissue with a rounded contact surface of the first electrode; and
    contacting the target tissue with a rounded contact surface of the second electrode.

6. The method of claim 5 wherein the rounded contact surface of the first electrode is ellipsoidal, and wherein the rounded contact surface of the second electrode is ellipsoidal.

7. The method of claim 5 wherein the rounded contact surface of the first electrode is spheroidal, and wherein the rounded contact surface of the second electrode is spheroidal.

8. The method of claim 1 wherein applying RF energy further comprises:
    accepting, at a controller for the electrosurgical coagulation device, an indication of a flow rate setting from a plurality of flow rate settings;
    accepting, at the controller, an indication of an applied voltage setting;
    providing energy to the first and second electrodes in a range of voltages determined by the applied voltage setting, the energy provided changes over time as a function of impedance experienced between the first and second electrodes; and simultaneously
    pumping the electrically conductive fluid through the first through fourth nozzles, the flow rate selected by the controller from a table that relates the applied voltage setting and the flow rate setting, and the flow rate remains constant as the energy provided changes over time.

9. The method of claim 1 wherein the first longitudinal axis is parallel to the second longitudinal axis.

10. An electrosurgical device, comprising:
a handle having an irrigation lumen disposed therein;
a cable coupled to a proximal end of the handle, the cable defining a first electrical conductor and a second electrical conductor;
an elongate shaft coupled to the handle and defining a distal end opposite the handle;
a first electrode disposed on the distal end of the elongate shaft and electrically coupled to the first electrical conductor, the first electrode defining a rounded contact surface opposite the distal end of the elongate shaft, a non-circular medial cross-section, and a first longitudinal axis;
a second electrode disposed on the distal end of the elongate shaft and electrically coupled to the second electrical conductor, the second electrode defining a rounded contact surface opposite the distal end of the elongate shaft, a non-circular medial cross-section, and a second longitudinal axis that is coplanar with the first longitudinal axis;
a first nozzle defined by the first electrode, the first nozzle fluidly coupled to the irrigation lumen, the first nozzle defining a first spray direction 90 angular degrees (°) relative to a line that intersects both the first longitudinal axis the second longitudinal axis;
a second nozzle defined by the second electrode, the second nozzle fluidly coupled to the irrigation lumen, the second nozzle defining a second spray direction 90° relative to the line;
a third nozzle defined by the first electrode, the third nozzle fluidly coupled to the irrigation lumen, the third nozzle defining a third spray direction, the first spray direction and the third spray direction defining a first angle bisected by the line, and the first angle being 180°; and
a fourth nozzle defined by the second electrode, the fourth nozzle fluidly coupled to the irrigation lumen, the fourth nozzle defining a fourth spray direction, the second spray direction and the fourth spray direction defining a second angle bisected by the line, and the second angle being 180°,
wherein the first electrode includes only the first and third nozzles and the second electrode includes only the second and fourth nozzles,
wherein the first nozzle and the third nozzle are coaxial along a third longitudinal axis that (i) does not intersect the first longitudinal axis and (ii) is located on an interstitial side of the first longitudinal axis such that the third longitudinal axis of the first nozzle and the third nozzle is offset from the first longitudinal axis toward the interstitial side of the first longitudinal axis, and
wherein the second nozzle and the fourth nozzle are coaxial along a fourth longitudinal axis that (i) does not intersect the second longitudinal axis and is located on an interstitial side of the second longitudinal axis such that the fourth longitudinal axis of the second nozzle and the fourth nozzle is offset from the second longitudinal axis toward the interstitial side of the second longitudinal axis.

11. The electrosurgical device of claim 10:
wherein the first nozzle is on an interstitial side of the first longitudinal axis, and the third nozzle is on the interstitial side of the first longitudinal axis; and
wherein, the second nozzle is on the interstitial side of the first longitudinal axis, and the fourth nozzle is on the interstitial side of the first longitudinal axis.

12. The electrosurgical device of claim 10, wherein the first and third nozzles are mirror images of locations of the second and fourth nozzles, respectively, across an interstice between the first electrode and the second electrode.

13. The electrosurgical device of claim 10 wherein the first, second, third, and fourth spray directions reside in a common plane.

14. The electrosurgical device of claim 10 further comprising:
wherein the first and third spray directions form a first acute angle with respect to the first longitudinal axis, the first acute angle opens toward the rounded contact surface of the first electrode; and
wherein the second and fourth spray directions form a second acute angle with respect to the second longitudinal axis, the second acute angle opens toward the rounded contact surface of the second electrode.

15. The electrosurgical device of claim 10 wherein the rounded contact surface of the first electrode is ellipsoidal, and wherein the rounded contact surface of the second electrode is ellipsoidal.

16. The electrosurgical device of claim 10 wherein the rounded contact surface of the first electrode is spheroidal, and wherein the rounded contact surface of the second electrode is spheroidal.

17. The electrosurgical device of claim 10 wherein the first electrode is rigidly coupled to the elongate shaft and immovable relative to the second electrode, and the second electrode is rigidly coupled to the elongate shaft and immovable relative to the first electrode.

18. The electrosurgical device of claim 10 wherein a line between an apex of the rounded contact surface of the first electrode and an apex of the rounded contact surface of the second electrode is perpendicular to the first longitudinal axis of the first electrode.

19. The electrosurgical device of claim 10 wherein the first electrode and the second electrode each have a cross-section that is polygonal.

20. The electrosurgical device of claim 19 wherein the first electrode and the second electrode each have a cross-section that is square.

21. The electrosurgical device of claim 10 wherein the first electrode and the second electrode each have a cross-section that is square with a chamfered corner.

22. The electrosurgical device of claim 10 wherein the second longitudinal axis is parallel to the first longitudinal axis.

* * * * *